US006731140B2

(12) United States Patent
Masleid et al.

(10) Patent No.: US 6,731,140 B2
(45) Date of Patent: May 4, 2004

(54) COMPLEMENT RESET MULTIPLEXER LATCH

(75) Inventors: Robert P. Masleid, Monte Sereno, CA (US); Akihiko Harada, San Jose, CA (US); Christophe Giacomotto, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/421,991

(22) Filed: Apr. 22, 2003

(65) Prior Publication Data

US 2003/0231040 A1 Dec. 18, 2003

Related U.S. Application Data

(63) Continuation-in-part of application No. 10/170,948, filed on Jun. 12, 2002, now Pat. No. 6,577,176.

(51) Int. Cl.⁷ .............................................. H03K 17/00
(52) U.S. Cl. ........................................ 327/99; 327/407
(58) Field of Search ........................... 327/99, 170, 407

(56) References Cited

U.S. PATENT DOCUMENTS

| 5,610,548 A | 3/1997 | Masleid |
| 5,614,845 A | 3/1997 | Masleid |
| 5,656,963 A | 8/1997 | Masleid et al. |
| 5,894,419 A | 4/1999 | Galambos et al. |
| 5,926,050 A | 7/1999 | Proebsting |
| 6,025,738 A | 2/2000 | Masleid |
| 6,243,797 B1 * | 6/2001 | Merritt ........................ 711/167 |
| 6,260,154 B1 * | 7/2001 | Jeddeloh ...................... 713/401 |
| 6,323,706 B1 | 11/2001 | Stark et al. |
| 6,366,115 B1 | 4/2002 | DiTommaso |
| 6,411,135 B2 * | 6/2002 | Komoto ........................ 327/99 |
| 6,426,652 B1 | 7/2002 | Greenhill et al. |
| 6,466,063 B2 | 10/2002 | Chen |
| 6,496,050 B2 * | 12/2002 | Lloyd .......................... 327/407 |
| 6,501,304 B1 * | 12/2002 | Boerstler et al. ............. 327/99 |
| 2003/0011413 A1 | 1/2003 | Masleid |

OTHER PUBLICATIONS

Stojanovic, V. and Oklobdzija, V. "Comparative Analysis of Master–Slave Latches and Flip–Flops for High–Performance and Low–Power Systems", IEEE Journal of Solid-State Circuits, vol. 34, No. 4, Apr. 1999, pp. 536–548.

* cited by examiner

Primary Examiner—My-Trang Nu Ton
(74) Attorney, Agent, or Firm—Fenwick & West LLP

(57) ABSTRACT

A complement reset multiplexer latch is provided. The complement reset multiplexer latch selectively regenerates a first or a second data input signal on an output node. To react to rising edges of the first or the second data signal, the complement reset multiplexer latch includes a first and a second rising edge pulse reset control. To react to falling edges of the first or the second data signal, the complement reset multiplexer latch includes a first and a second falling edge pulse reset control. The complement reset multiplexer latch also selectively holds the output node at a stored value responsive to a clock signal. A multiplexer is used to select from the first or the second data input the value that is stored.

25 Claims, 14 Drawing Sheets

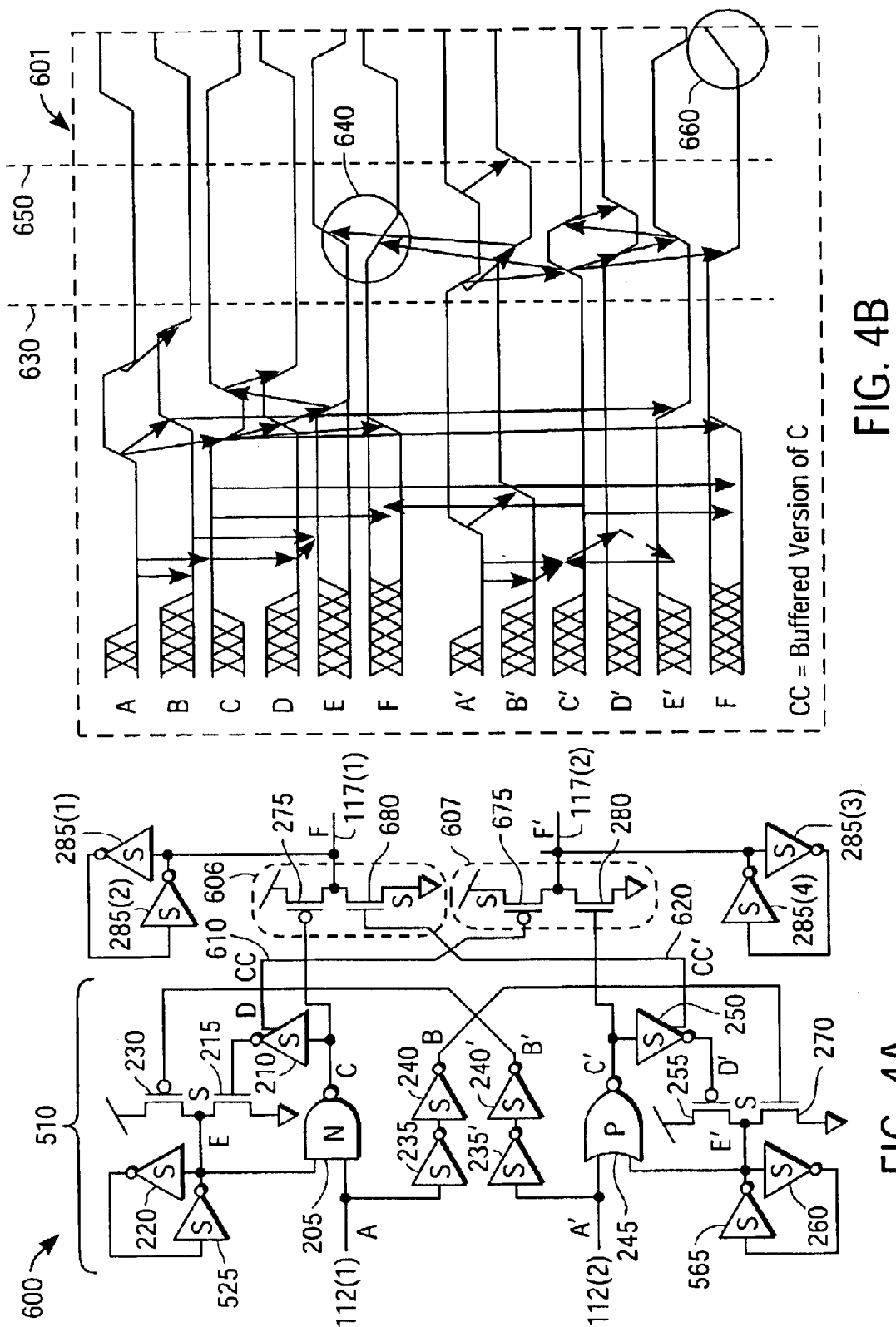

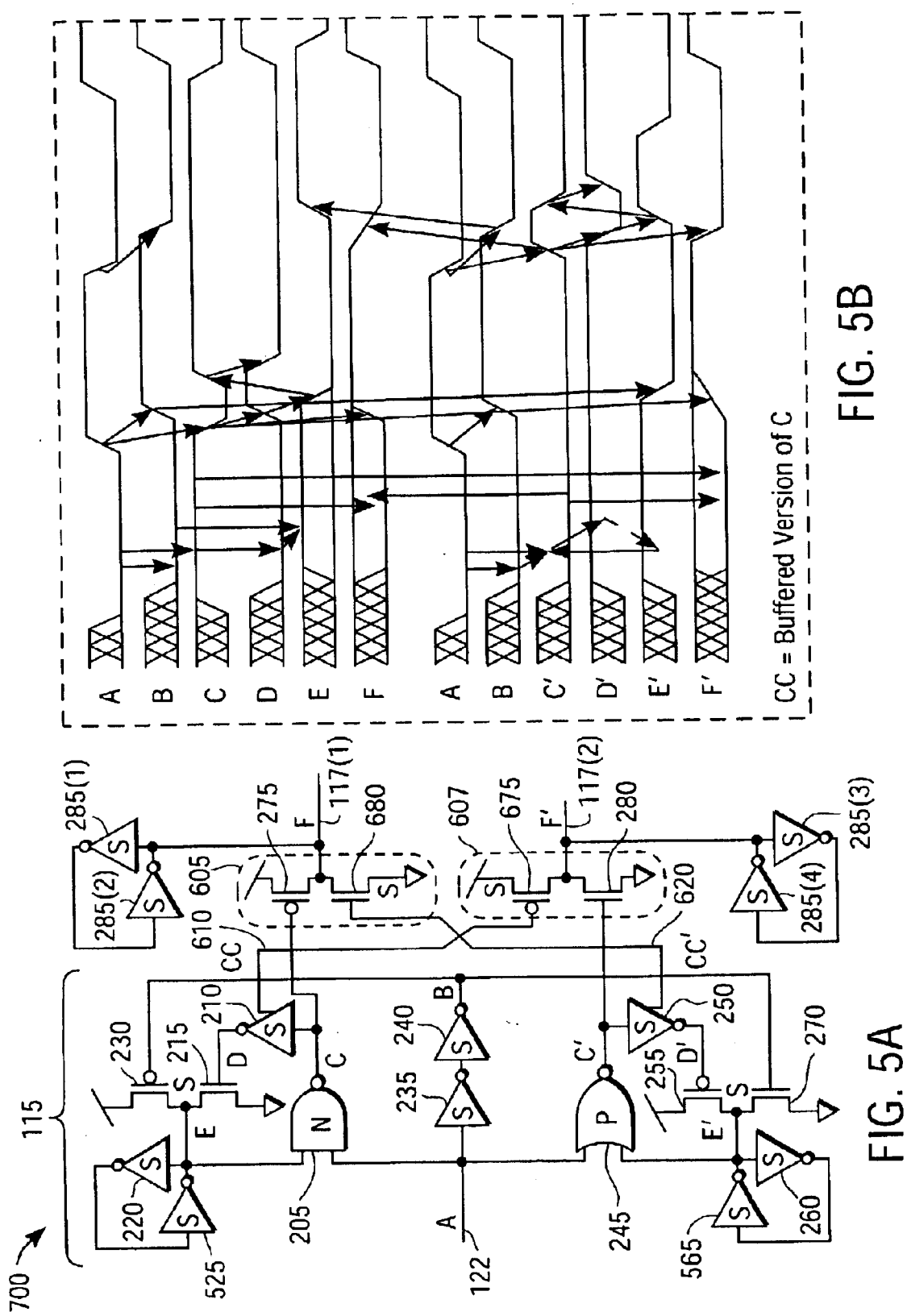

COMPLEMENT RESET MULTIPLEXER LATCH

RELATED APPLICATION

This application is a continuation-in-part of U.S. patent application Ser. No. 10/170,948, filed on Jun. 12, 2002, now U.S. Pat. No. 6,577,176, entitled "Complement Reset Latch," from which priority is claimed and from which relevant portions of the application are incorporated by reference.

FIELD OF THE INVENTION

This invention relates generally to logic latches and multiplexers and, more particularly, to selecting between a number of input signals and to storing the state of the selected signal along a long path in an integrated circuit or cross-chip interconnect.

BACKGROUND OF THE INVENTION

The operating speed of integrated circuits, such as microprocessors, is continually increasing. Typical high-speed integrated circuits have a clock cycle frequency greater than one gigahertz. In these devices, it is desirable to communicate data signals as quickly as possible. Buffers or repeaters are conventionally used along integrated circuit wire routes or in cross-chip interconnections to regenerate a degrading signal or to maintain fast transition times. Some cross-chip interconnections also need multiplexers to select between a number of input signals. For example, the data bus returning from a large on-chip cache contains multiplexer to implement block redundancy and latches to implement pipeline stages. As clock cycle frequency increases, clock cycle period becomes shorter, which makes it difficult for signals to propagate between circuit elements during one clock cycle period. Pipelining of a long wire or cross-chip interconnect is needed to preserve data integrity and meet timing constraints.

One conventional approach to pipelining or to multiplexing long wire paths is to insert a standard latch or multiplexer in the wire path. This approach suffers, however, from poor performance. Typical latches and multiplexers have insertion delay and poor signal regeneration or signal driving characteristics. Regenerating the driving signal consumes further valuable time.

Another conventional technique is building a latch into an ordinary buffer. An ordinary buffer commonly includes two inverters in series. In a conventional CMOS design, the inverters are each formed from an NFET and a PFET transistor. Clock gating devices are commonly placed in series with the input NFET and input PFET devices. A problem with this technique is that adding clock gating devices along the critical path adds significant delay. Although faster than inserting a standard latch and regenerating the driving signal, this technique is expensive in chip area, clock power, and delay.

A conventional multiplexer can be used to select between a number of input signals. In a conventional multiplexer, the transistors that implement the select function are series-stacked onto the input nodes. Inserting a multiplexer and a latch can cause a significant delay of 3 to 6 data inversions along the critical path.

What is therefore needed is a repeater or buffer multiplexer latch that is efficient as a buffer, a multiplexer, and a data latch, that has low additional insertion delay, and that consumes little clock power.

SUMMARY OF THE INVENTION

In an embodiment of the invention, a multiplexer is integrated into a complement reset latch. The complement reset multiplexer latch performs efficiently as a long wire signal repeater, a data latch, and a multiplexer. That is, a complement reset multiplexer latch is used to select between a number of input data signals, to regenerate the selected input data signal, and to hold an output signal at a stored value. Additionally, there is no latch insertion delay because the critical paths of the underlying complement reset buffer are unaffected by the latch transistors. The multiplexer insertion delay is nearly zero as well. The multiplexer functionality adds a single FET side-branch load per critical path, rather than conventionally series-stacking the select transistors. The latch clock FETs are small devices that consume little power. Clock devices in the non-critical multiplexer paths are doubled in number versus the complement reset latch. This results in a clock load that is approximately 5 times smaller than a conventional latch. A complement reset multiplexer latch allows for efficient design of cross-chip paths, such as cache memory interfaces. Because a complement reset multiplexer latch is built into a complement reset buffer, complement reset buffers and complement reset latches can be easily replaced with complement reset multiplexer latches where needed to meet timing or datapath constraints.

In another embodiment of the present invention, a multiplexer is integrated into a complement reset buffer. The complement reset multiplexer does not include the data latch functionality of the complement reset multiplexer latch. The complement reset multiplexer is a buffer or repeater with an integrated low insertion delay multiplexer for applications that do not require the output signal to be held at a store value.

BRIEF DESCRIPTION OF THE DRAWINGS

FIGS. 4a and 4b are, respectively, schematic and timing diagrams for a pulse-in-pulse-out complement reset buffer.

FIGS. 5a and 5b are, respectively, schematic and timing diagrams for a level-in-pulse-out complement reset buffer.

DETAILED DESCRIPTION OF THE EMBODIMENTS

The present invention relates to a complement reset multiplexer latch for use in an integrated circuit to select between a number of input signals, to drive data signals across a long path and to store the state of data signals when the distance the signals need to travel includes propagation delays that exceed one clock cycle or cross a latch boundary. Embodiments of a complement reset buffer are first described below, a description of embodiments of a complement reset latch is described next, followed by a description of embodiments of a complement reset multiplexer latch.

A. Complement Reset Buffer

A complement reset buffer can be used to facilitate the propagation of data signals across a long wire. In conventional integrated circuit technology, data signals which propagate across long wires typically degrade due to fan-out, resistance, capacitance, and power problems which increase the transition time for a rising or falling edge of a data signal. As transition times increase, the system must operate at a slower clock speed in order to allow the data signal to fully transition so that valid data may be processed. In conventional integrated circuit technologies, wires longer than 1 mm may be considered long. This is especially true for systems operating at higher clock speeds. In order to preserve the data integrity, and to maintain acceptable transition times, buffers, or repeaters, are often placed periodically along a long wire in order to amplify the data signal as well as to maintain fast transition times.

Figure 1:
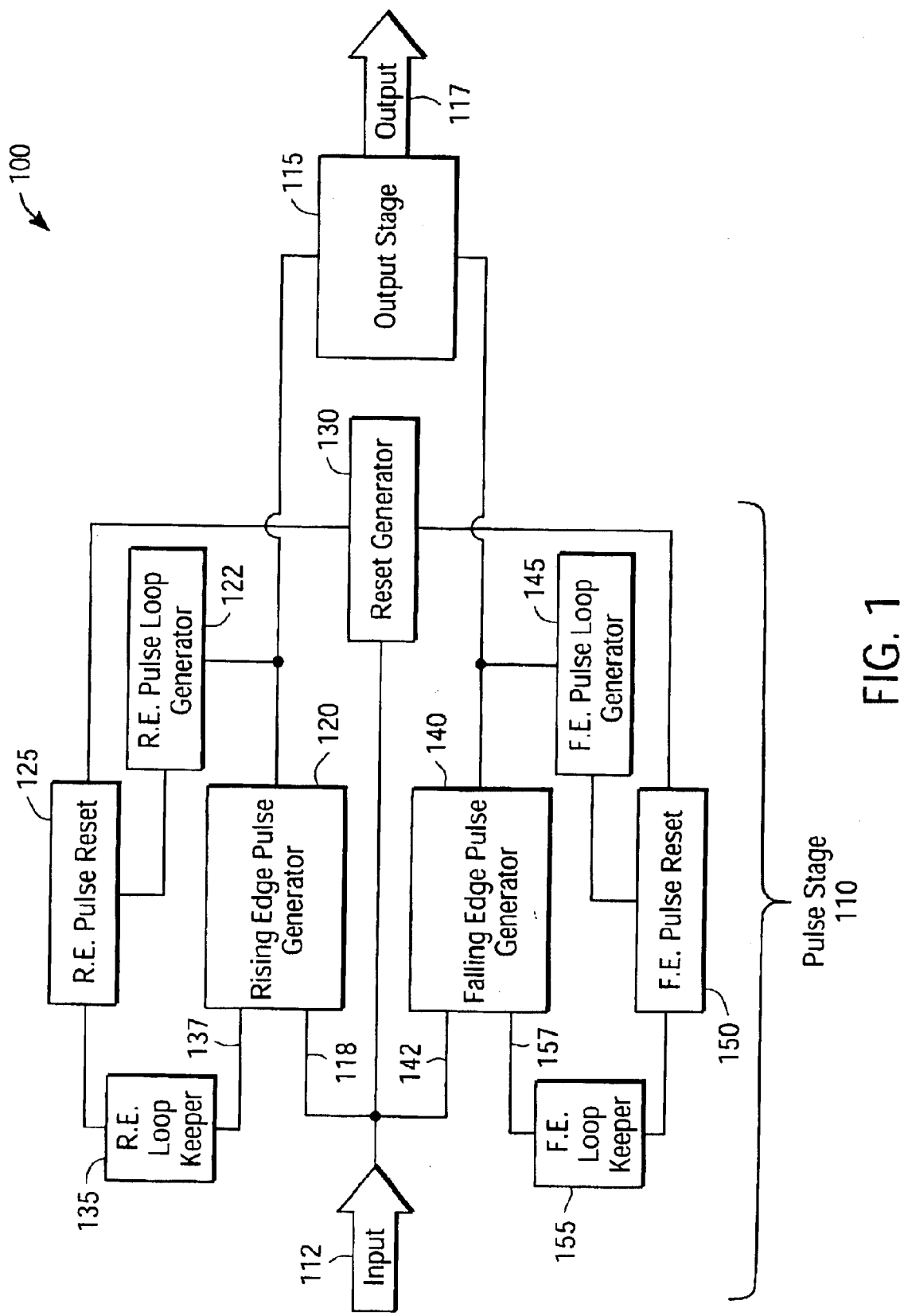
FIG. 1 is a high-level block diagram of one embodiment of a complement reset buffer.

FIG. 1 illustrates a high-level block diagram of one embodiment 100 of a complement reset buffer. The buffer 100 generally includes a pulse stage 110 where pulses are generated from an input 112, and an output stage 115 where the pulses are used to create an output 117 that corresponds to the input 112. The pulse stage 110 may also be divided into two separate circuits. The first circuit is configured to react to the rising edge of input 112 and outputs a rising-edge pulse to the output stage 115 to trigger a transition in the output 117. The rising-edge pulse ends before a falling edge appears on the input 112. The second circuit is configured to react to the falling edge of input 112 and outputs a falling-edge pulse to the output stage 115 to trigger a transition in the output 117. The second circuit ends the falling-edge pulse before a rising edge appears on the input 112.

In the remainder of the description, the term "complement" will be used to distinguish between the first and second circuits, as well as between a rising and falling edge. The term "complement" is not intended to indicate any particular logic value but merely provides a convenient manner in which to discuss the operation of the two circuits in the buffer 100.

The first circuit includes a rising-edge pulse generator 120, a rising-edge pulse loop generator 122, a rising-edge loop keeper 135 and a rising-edge pulse reset 125. Additionally, the first circuit receives a reset signal from a reset generator 130.

In operation, the first circuit receives the data on input 112 at a first input 118, and outputs a rising-edge pulse to drive the output stage 115 when a rising edge is detected. In order to avoid crowbar current and other problems associated with a conventional buffer, the rising-edge pulse must end before a falling edge is detected on input 112, at which point the second circuit operates. In order to shut off the rising-edge pulse, the first circuit loops the rising-edge pulse back through the rising-edge pulse loop generator 122, the rising-edge loop keeper circuit 135, and back into a second input 137 on the rising-edge pulse generator 120. Once the looped pulse is received, the generator 120 stops outputting the rising-edge pulse. In order to set the width of the rising-edge pulse, the rising-edge pulse loop generator 122 is configured to receive the rising-edge pulse, and to delay it, before looping it back to the generator 120.

The use of the pulse loop provides advantages over conventional inverter-based pulse generators. As noted above, inverter-based pulse generators cannot respond adequately to data with slow transition times. This is primarily due to the fact that in inverter-based pulse generators, the shut-off signal is generated from the input, and may get to the generator before the pulse has been generated. However, a complement reset buffer advantageously generates its shut-off signal, i.e. the looped pulse, from the output of the pulse generator 120, ensuring that the generator 120 has ample time to react to the slow transition time. Additionally, the first circuit has only one active device on the input 112, compared to an inverter-based pulse generator which has both the generator and the inverter tied to the input. By reducing the number of components on the input 112, the first circuit avoids the fan-out and noise problems commonly associated with inverter-based pulse generators.

While the use of a pulse loop is advantageous in receiving a variety of signals with a wide range of transition times, care must be taken to avoid having the generator 120 oscillate while the data input 112 remains high. It is the function of the rising-edge loop keeper circuit 135 to effectively create a one-shot pulse generator. This is done by breaking the pulse loop after the initial delayed pulse has passed through the loop keeper circuit 135. The loop keeper circuit 135 subsequently holds the second input 137 to the generator 120 at a value which keeps the generator 120 from outputting additional pulses. It is generally preferable to have a first circuit which may react to all incoming rising edges on input 112. Therefore, rising-edge pulse reset 125 is configured to receive a reset signal from reset generator 130. The reset signal triggers rising-edge pulse reset 125 to disengage the rising-edge loop keeper circuit 135 and to put a value on the second input 137 of the generator 120 which will enable it to react to a subsequent rising edge in the data input 112.

Typically, a buffer is configured to react only once to each rising or falling edge in the data at input 112. Thus, reset generator 130 is configured to wait for a falling edge, i.e. the complement of a rising edge, before generating the reset signal for rising-edge pulse reset 125. The reset generator 130 advantageously uses the complement on input 112 to ensure that rising-edge pulse generator 120 is not reset until the data input is in a logical "0" state. By using the complement to trigger a reset, a complement reset buffer avoids requiring external control or clock signals to implement the reset. Additionally, this allows the buffer to run at whatever rate the data runs at since the data itself effectively resets the buffer at each transition. Further, active power of this circuit goes to zero when data activity goes to zero. This is advantageous for power-constrained applications.

The second circuit acts as the complement of the first circuit and is configured to react to the falling edge of input 112. The general operation and structure of the second circuit is similar to the operation and structure of the first circuit. The second circuit includes a falling-edge pulse generator 140 which receives input 112 at a first input 142, and outputs a falling-edge pulse to the output stage 115 and to a falling-edge pulse loop generator 145 in response to a detected falling edge on the input 112. The falling-edge pulse loop generator 145 delays the falling-edge pulse and outputs a delayed falling-edge pulse to a falling-edge loop keeper circuit 155. The falling-edge loop keeper circuit 155 completes the loop by sending the delayed falling-edge pulse into a second input 157 on the falling-edge pulse generator 140. The falling-edge loop keeper circuit 155 is triggered by the delayed falling-edge pulse and effectively shuts off further pulse generation in falling-edge pulse generator 140. A falling-edge pulse reset 150 receives a reset signal from reset generator 130 and resets the falling-edge loop keeper circuit 155 and the falling-edge pulse generator 140 so that the generator 140 can respond to a subsequent detected falling edge in input 112. The reset generator 130 provides the reset signal to the falling-edge pulse reset 150 during the second circuit's data complement, i.e. a logical "1" on input 112.

Figure 2:
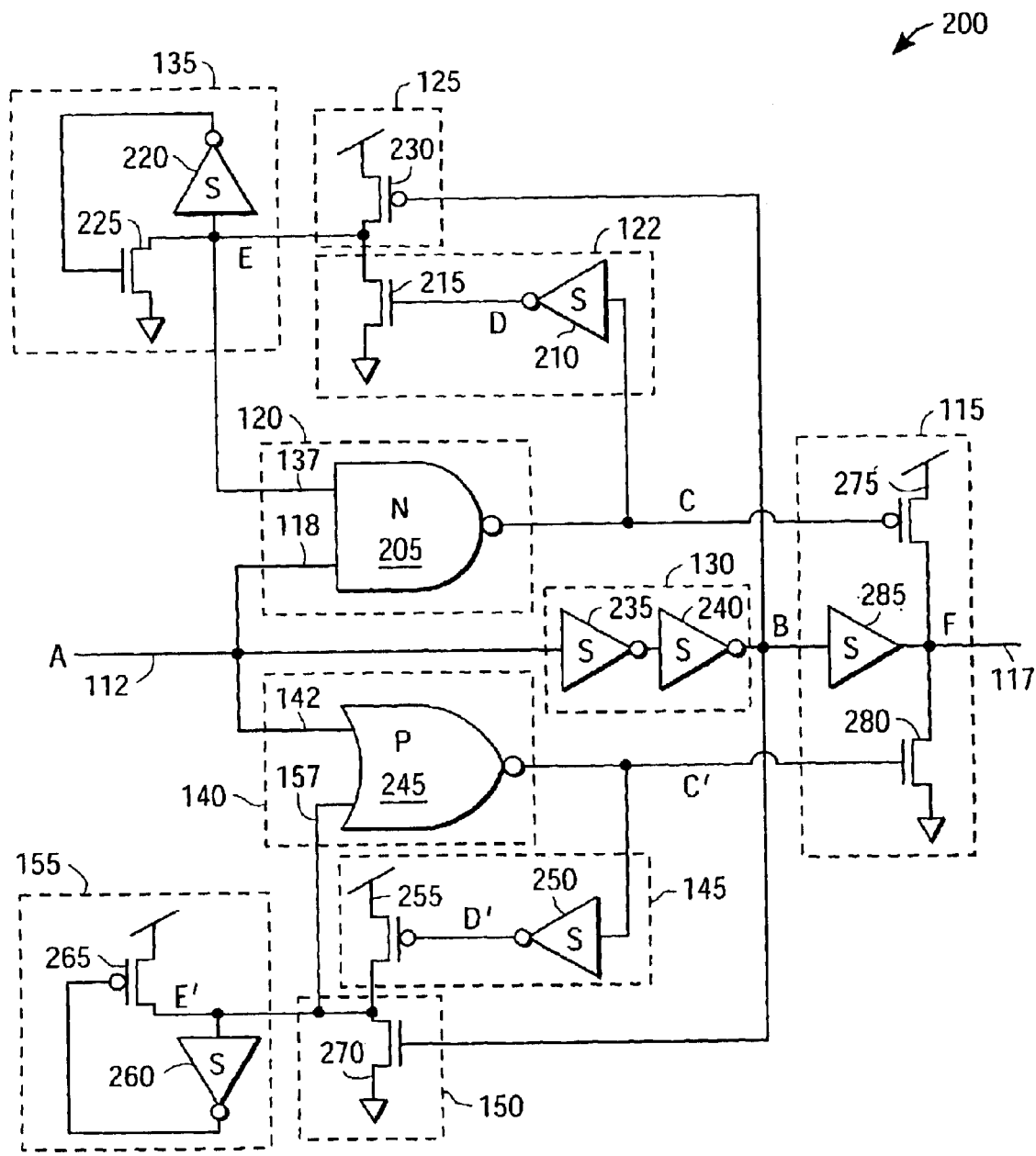
FIG. 2 is a schematic view of a level-in-level out complement reset buffer.

FIG. 2 illustrates a schematic view of a buffer 200. Buffer 200 shows the buffer 100 of FIG. 1 with specific structure for each element. FIG. 2 includes the reference letters "A"-"E" and "B'"-"D'" to indicate points in the circuit which are examined for discussion later herein with reference to FIG. 6a. Additionally, the components in FIG. 2 are marked with an "S", "N" or "P". The inverters marked with an "S" indicate "small" inverters, which are slow and do not consume a lot of power or space within the buffer 200. Devices marked with an "N" indicated devices which are skewed to react quickly to a rising edge in a signal. Typically, these devices are slower when reacting to a falling edge. Conversely, devices marked with a "P" are skewed to react quickly to a falling edge in a signal and do not react quickly to a rising edge.

In this embodiment the rising-edge pulse generator 120 includes an "N"-skewed NAND gate 205. As noted above, the NAND gate 205 is skewed to react quickly to a rising edge in the data input 112. The NAND gate 205 has a first input 118 and a second input 137. The first input 118 receives the data from input 112 and the second input 137 ultimately receives the looped pulse from the rising-edge loop keeper circuit 135.

The rising-edge pulse loop generator 122 includes a "small" inverter 210 coupled to the output of the NAND gate 205 to receive the pulse, and to the gate of a NFET transistor 215. The NFET 215 has its drain coupled to the ground plane of the integrated circuit, and its source is coupled to the rising-edge loop keeper circuit 135 and to the second input 137 of the NAND gate 205. In this embodiment, the loop generator 122 first inverts and delays the pulse in the small inverter 210, and then inverts and delays it again through the NFET 215. Careful examination of the circuit reveals that by using only the NFET 215 instead of a complete inverter, the pulse loop is broken whenever the output from the NAND gate 205 is a logical "1". Thus, once the NAND gate 205 detects a rising edge and generates a logical "0", it passes back around to input the logical "0" on the second input 137 of the NAND gate 205 thereby shutting it "off" causing it to generate a logical "1". This logical "1" then breaks the loop by turning off NFET 215 and, assuming that the rising-edge pulse reset 125 is not active, the second input 137 to the NAND gate 205 would float at an indeterminate level.

The rising-edge loop keeper circuit 135 is provided to maintain the second input 137 of the NAND gate 205 at a logical "0" once the loop is broken. Rising-edge loop keeper circuit 135 includes a "small" inverter 220 with an input coupled to the source of NFET 215, and whose output is coupled to the gate of a NFET transistor 225. The NFET 225 drain is grounded and the source is coupled back to the inverter 220 input, and to the second input 137 of the NAND gate 205. When a logical "0" is asserted on the source of the NFET 215 in the pulse loop generator 122 (in response to the NAND gate 205 detecting a rising edge), the keeper circuit 135 turns on to maintain the logical "0" on the second input 137 of the NAND gate 205 until reset. The keeper circuit 135 typically comprises "weak" components to allow the components to be over-driven by other components in the system, e.g. the pulse reset 125.

It is the function of the rising-edge pulse reset 125 to assert a logical "1" at the input of the keeper inverter 220 in order to reset the first circuit for the next rising edge. By asserting a logical "1", the keeper circuit is over-driven and turns off, leaving the second input 137 of the NAND gate 205 under the control of the pulse reset 125. The pulse reset 125 comprises a PFET transistor 230 whose source is connected to a logical "1" and whose drain is connected to the input of inverter 220 and to the second input 137 of the NAND gate 205. The gate of PFET 230 is coupled to the output of reset generator 130 and the PFET 230 is turned on when it receives a logical "0" from the reset generator 130. A reset signal of logical "0" corresponds to the complement falling edge condition in the data input 112. As noted above, the pulse reset 125 asserts a logical "1" on the NAND gate 205 when the second circuit is active after a falling edge and before the next rising edge activates NFET 215.

The reset generator 130 comprises two small inverters 235, 240 which are wired in series such that inverter 235 receives input from data input 112, and provides the inverted signal to the input of inverter 240, which in turn provides the double-inverted signal to rising-edge pulse reset 125 and to falling-edge pulse reset 150. Thus in this embodiment the reset generator 130 acts to delay the input signal on its way to activating and deactivating the pulse resets 125, 150.

Note, in order to avoid excessive delay and crowbar current, the latency of the input 112 passing through the reset generator 130 should be just less than the latency of the input 112 passing through the NAND gate 205 and inverter 210. A low-duration tri-state condition on "E" is acceptable; leakage will not have time to significantly change the voltage on "E". This is reflected in the timing diagram 900 at 930 by indicating that both D and B transition at nearly the same time.

The second circuit is structured in a similar manner as the first circuit, with all the transistors now their complements (e.g., PFETs are NFETs and vice versa) and utilizing a two-input NOR gate 245 for the falling-edge pulse generator 140. More specifically, in this embodiment the NOR gate 245 is "P"-skewed to react quickly to a falling edge in the data input 112. The first input 142 of the NOR gate 245 receives the data from input 112 and the second input 157 ultimately receives the looped pulse from the falling-edge loop keeper circuit 155.

The falling-edge pulse loop generator 145 includes a "small" inverter 250 coupled to the output of the NOR gate 245 to receive the pulse, and to the gate of a PFET transistor 255. The PFET 255 has its source coupled to a supply representative of a logical "1" and its drain is output to the falling-edge loop keeper circuit 155 and to the second input 157 of the NOR gate 245. In this embodiment, the loop generator 145 first inverts and delays the pulse in the small inverter 250, and then inverts and delays it again through the PFET 255. Careful examination of the circuit reveals that by using only the PFET 255 instead of a complete inverter, the pulse loop is broken whenever the output from the NOR gate 245 is a logical "0". Thus, once the NOR gate 245 detects a falling edge and generates a logical "1", it passes back around to supply the logical "1" on the second input 157 to the NOR gate 245 thereby shutting it "off" causing it to generate a logical "0". This logical "0" then breaks the loop, and assuming that the falling-edge pulse reset 150 is not active, the second input 157 to the NOR gate 245 would float at an indeterminate level.

The falling-edge loop keeper circuit 155 is provided to maintain the second input 157 of the NOR gate 245 at a logical "1" once the loop is broken. Falling-edge loop keeper circuit 155 includes a "small" inverter 260 with an input coupled to the drain of PFET 255, and whose output is coupled to the gate of a PFET transistor 265. The PFET 265 source is connected to a logical "1" and the drain is coupled back to the inverter 260 input, and to the second input 157 of the NOR gate 245. When a logical "1" is asserted on the drain of the PFET 255 in the pulse loop generator 145 (in response to the NOR gate 245 detecting a falling edge), the keeper circuit 155 turns on to maintain the logical "1" on the second input 157 of the NOR gate 245 until reset. The keeper circuit 155 is typically comprised of "weak" components to allow the components to be over-driven by other components in the system.

It is the function of the falling-edge pulse reset 150 to assert a logical "0" at the input of the keeper inverter 260 in order to reset the second circuit for the next falling edge. By asserting a logical "0", the keeper circuit 155 is over-driven and turns off, leaving the second input 157 of the NOR gate 245 under the control of the pulse reset 150. The pulse reset 150 is comprised of a NFET transistor 270 whose drain is grounded and whose source is connected to the input of inverter 260 and to the second input 157 of the NOR gate 245. The gate of NFET 270 is coupled to the output of reset generator 130 and the NFET 270 is turned on when it receives a logical "1" from the reset generator 130. A reset signal of logical "1" corresponds to a rising edge condition in the data input 112. As noted above, the pulse reset 150 only asserts a logical "0" on the NOR gate 245 when the first circuit is active, after a rising edge and before the next falling edge activates PFET 270.

The output stage 115 includes a PFET transistor 275, a NFET transistor 280 and a weak keeper buffer 285. The PFET 275 has its source coupled to a logical "1", the gate is coupled to the output of NAND gate 205, and the drain is coupled to output 117 and the source of NFET 280. The NFET 280 has the gate coupled to the NOR gate 245 to receive the falling-edge pulse, and has the drain coupled to ground. The FETs 275, 280 switch on when the first or second circuit, respectively, is active and generates a pulse. As noted above, if both FETs 275, 280 are "on" simultaneously, a crowbar current is formed and performance and efficiency of the buffer is degraded. In order to avoid this, the pulses have a width long enough to activate their respective FET 275, 280, but not so long as to allow both FETs 275, 280 to be active at the same time. In the interim between a pulse and its complement pulse, both FETs 275, 280 are inactive and the output 117 is not driven. To avoid a tri-state condition, small buffer 285 is provided to slowly transfer the input 112 to the output 117 and to hold it there until overdriven by one of the FETs 275, 280 switching on. Ideally, the buffer 285 asserts the value of input 112 before the active FET 275 or 180 switches off.

Thus the operation of the output stage 115 may be considered in two stages. The primary stage involves the FETs 275, 280 and is configured to transfer the input signal 112 to the output 117 as quickly as possible, and with higher gain and faster transitions. As discussed above, this primary stage must go idle in between transitions. A secondary stage comprising the weak buffer 285 takes over in maintaining the input signal 112 on the output 117 until a new transition occurs. In this manner the buffer can achieve quick response and improved transition times in its output 117 as well as avoid a tri-state condition when the FETs 275, 280 switch off.

Buffer 200 utilizes a single input 112 and a single output 117. This particular buffer scheme is known as a Level-In-Level-Out buffer. Nearly all VLSI logic circuits are LILO. LILO requires only a single wire to carry a logic signal from one circuit to another. Furthermore, LILO is noise robust because noise pulses eventually decay and the correct levels eventually appear at the circuit outputs. Additionally, LILO is low energy since there is only one transition for each change in logic state. This style buffer is commonly used for single-wire data transmission.

Figure 6A:
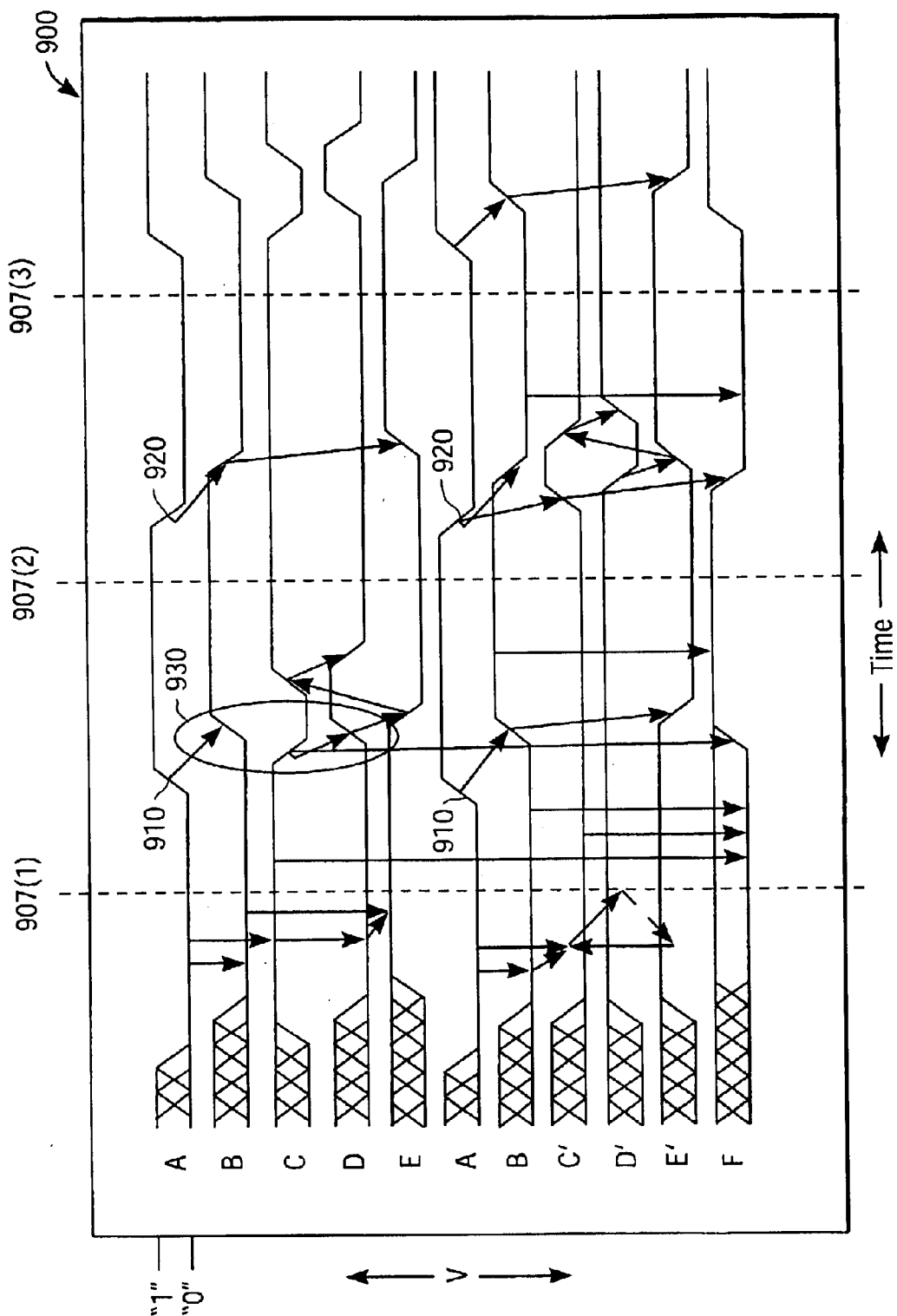
FIG. 6a is a timing diagram which illustrates signals associated with operation of the buffer in FIG. 2.

FIG. 6a illustrates a timing diagram 900 for signals associated with the buffer in FIG. 2. Timing diagram 900 illustrates nine waveforms "A"-"F" and "B'"-"E'", with the vertical axis representing voltage and the horizontal axis representing time. Each waveform represents the signal which is present in the buffer at points "A"-"F" and "B'"-"E'" as illustrated in FIG. 2. More specifically, "A" is the input 112; "F" is the output 117; "B" is the reset signal from the reset generator 130; "C" and "C'" are the pulses out of the pulse generators 120, 140; "D" and "D'" are the outputs from the small inverters 210, 250 in the pulse loop generators 122, 145; and "E" and "E'" are the second inputs 137, 157 to the pulse generators 120, 150.

Figure 6B:
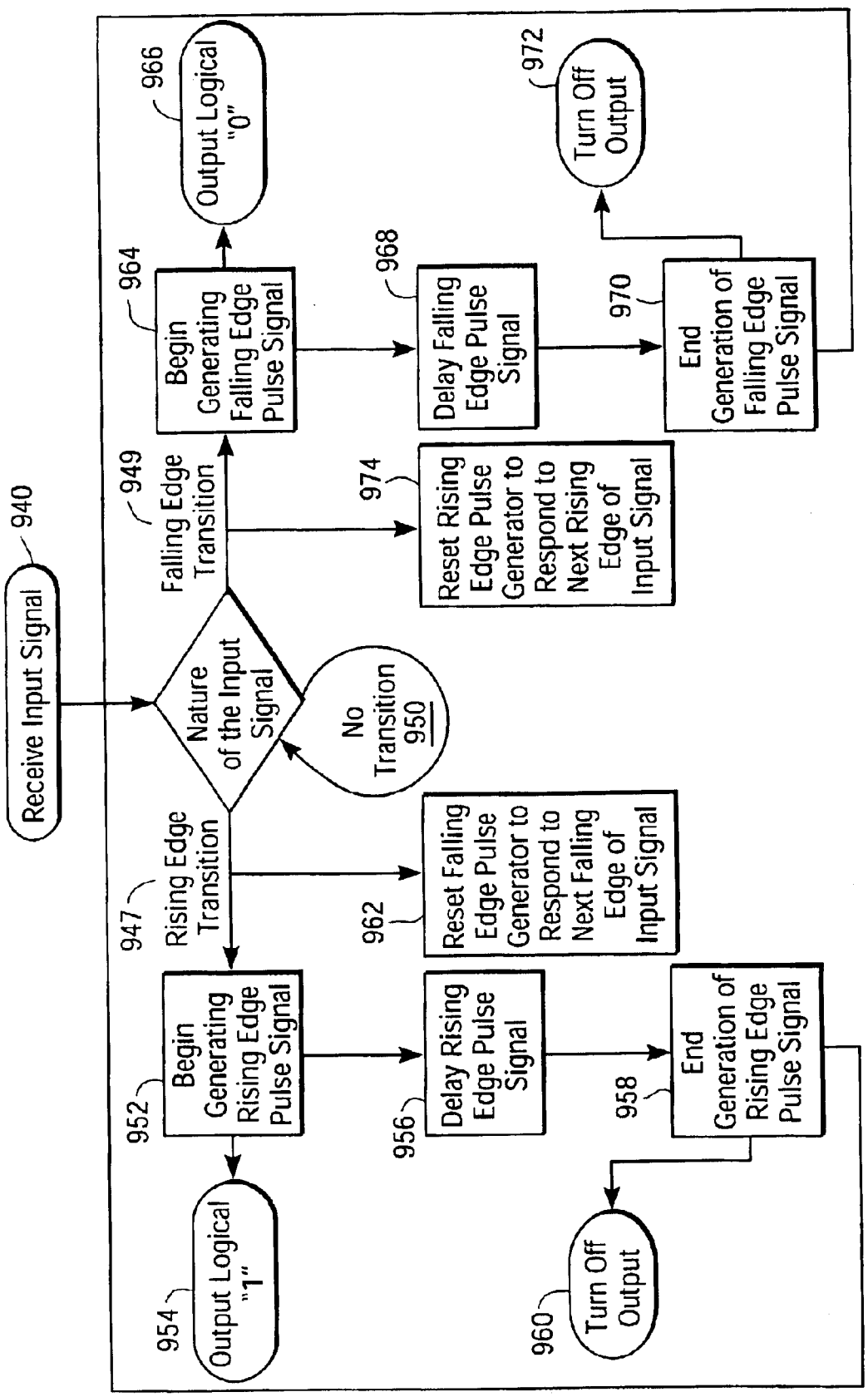
FIG. 6b is a process flow diagram which illustrates operational events associated with the buffer in FIG. 2.

FIG. 6b illustrates a process flow associated with the operation of the buffer 200 and will now be discussed concurrently with FIG. 6a. There are three points in time 907(1), (2), (3) illustrated in the timing diagram 900 which represent the steady state of the buffer. The steady state occurs when all internal transitions have ceased, the pulses have stopped, and the output 117 is held by the buffer 285. At time 907(1), the output of the buffer is a logical "0" as shown in signal "F". This corresponds to the input signal "A" which is also a logical "0". The reset signal "B" also reflects the input signal "A" and triggers rising-edge pulse reset 125 to assert a logical "1" at the second input "E" of the NAND gate 205. This readies the NAND gate 205 to respond to a rising edge transition in the input "A". Additionally, "C" is a logical "1" which indicates that the rising-edge pulse is not active. The rising-edge pulse is active-low, since it is fed to the PFET 275, which is also active-low. Similarly "C'" is at logical "0" which indicates that the active-high falling-edge pulse is not active. "D" inverts "C" and is thus a logical "0" which has turned off NFET 215. Likewise "D'" inverts "C'" and is a logical "1" which has turned off PFET 255. Notice that the second input "E'" to the NOR 245 is held high as well, which effectively turns off the NOR 245. "E'" is held high by the falling-edge loop keeper circuit 155. Also note that both "B" and "D'" have turned off their respective FETs 255, and 270.

A rising edge transition 910 in "A" triggers 947 the activation of the first circuit. As noted above, the first circuit reacts to a rising edge at the input 112. The transition 910 causes the NAND 205 to generate 952 a logical "0" at "C". "C" then drives 954 "F" high since the PFET 275 is active and pulls "F" up. The pulse passes 956 through small inverter 210 to become a logical "1" and switches on NFET 215.

The second input "E" to NAND gate 205 follows the transition in "D" and goes low. "E" is delayed by the latency of the NFET 215. Likewise, "E'" goes low since reset generator 130 has set "B" high which switches NFET 270 to drive E' to logical "0". This resets 962 the NOR gate 245 for a subsequent falling edge transition 920. Once "E" goes low, the NAND gate 205 shuts off the pulse by driving "C" high again. Consider that the delays associated with inverter 210 and NFET 215 help determine the pulse width of "C". By the time "C" is driven high, the signal at "B" propagates through buffer 285 to maintain the output "F" at the same as the input "A". This allows the PFET 275 to turn off 960 in response to "C" going high without causing a tri-state condition on the output "F". If the buffer 285 is too slow, once the PFET 275 switches off 960, the buffer may assert a logical "0" as a holdover from the previous falling edge operation until the new input propagates through. This would cause the output "F" to transition incorrectly.

The change in "C" also propagates through the inverter 210 and drives "D" low, which in turn shuts off the NFET 215. However, "E" remains low since the rising-edge loop keeper circuit 135 maintains the logical "0". "E" must continue to be driven by falling-edge pulse reset 150. At this point in the operation, the buffer has reached the second steady state time 907(2), which lasts until "A" transitions low 949 at falling edge transition 920. It should be recognized from the above description how the second circuit is triggered 949 by a falling edge, begins generating the falling-edge pulse signal 964, causes "F" to output low 966, delays 968 the falling-edge pulse signal through the falling-edge loop generator 145, ends 970 the generation of the falling-edge pulse signal, turns off 972 the output at the NFET 280, and resets 974 the rising-edge pulse generator.

Note that the structure of the keeper circuit 135 only maintains a logical "0" at "E" and that it shuts off completely when the pulse reset 125 drives "E" high. Likewise, the falling-edge loop keeper circuit 155 only maintains "E'" at a logical "1" and shuts off when the falling-edge pulse reset 150 sets "E'" to a logical "0". In an alternate embodiment, both keeper circuits 135, 155 may be constructed by substituting their lone FETs 225, 265 for a small inverter. The substitution of the FET for an inverter will allow the keeper circuit to maintain either a logical "1" or a logical "0" and may require less delay from a transition in "A" to "B". However, such a substitution also increases the power and size costs of the buffer.

Figures 3A, 3B:
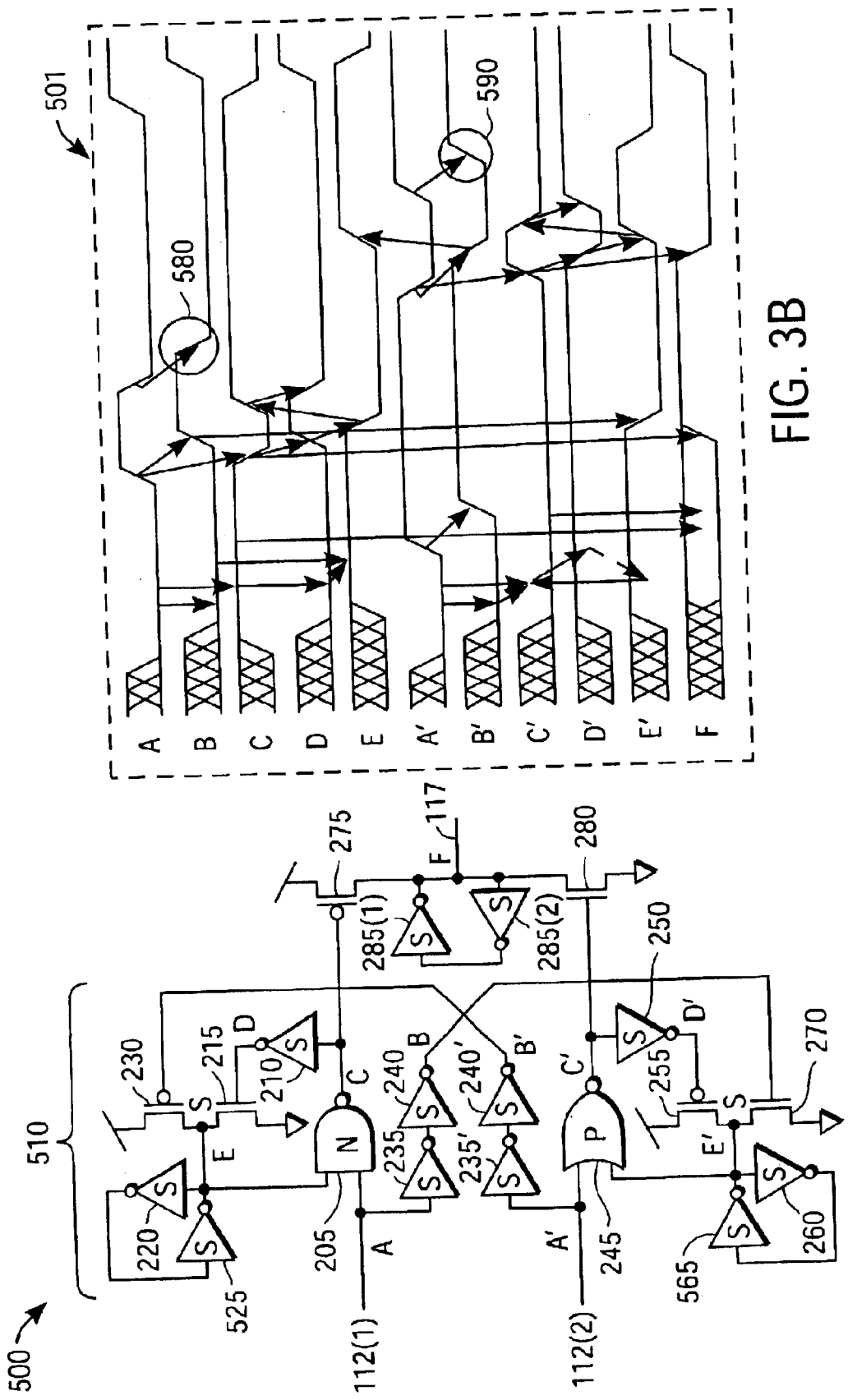
FIGS. 3a and 3b are, respectively, schematic and timing diagrams for a pulse-in-level-out complement reset buffer.

The complement reset topology and pulse loop of a complement reset buffer may also be used to form other types of buffers. FIGS. 3a and 3b illustrate a schematic and timing diagram 501 for a pulse-in-level-out (PILO) buffer 500. FIGS. 3a and 3b illustrate the PILO buffer 500 in a manner similar to FIGS. 2 and 6a, including the use and identity of the signals "A"-"F", and "C'"-"E'". Two additional signals, "A'" and "B'" are also illustrated. "A'" corresponds to the negative input provided by a two wire pulse communication system. In pulse communication systems a single data signal input 112 is converted into two pulse signals 112(1) and 112(2). Pulse signal 112(1) pulses high when a rising edge is detected in data input 112. Pulse signal 112(2) pulses low when the data input 112 has a falling edge. The leading edges of pulses 112(1) and 112(2) carry the information of input 112 and are used. The trailing edges carry no information and are not used by the system. Pulse communication schemes are useful in ensuring that each information-bearing transition is as fast as possible across a long wire by maintaining separate signals for each transition. This allows each communication line to use skewed buffers for lower critical edge latency. Buffer 500 receives the pulse inputs "A" and "A'" and output a level output "F". In effect, buffer 500 both buffers and boosts the data signal, and also converts the signal from a pulse to a level communication system by combining "A" and "A'" into a single output "F".

The pulse stage 510 is similar in operation to the pulse stage 110 illustrated in FIG. 2 with the following differences. First, the reset signal "B" is now generated as two separate signals "B" and "B'". This is required since "A" and its complement "A'" are provided separately, and may not be orthogonal. This requires modification to the reset generator 130. The reset generator includes two additional inverters 235' and 240'. The additional inverters are wired in series and the input of inverter 235' receives "A" from input 112(2) and the output of 240' is "B'" which acts as the reset signal for the rising-edge pulse reset 125, and specifically PFET 230. Inverter 235 receives input from "A" from input 112(1) but now the output from inverter 240 acts as the reset signal "B" only for NFET 270 in the falling-edge pulse reset 150.

The reset strategy is the same as in the above-described buffer 200. Each circuit in the pulse stage 510 is reset during the operation of the complement circuit. However, now that "A" and "A'" each are in pulse form, the loop keeper circuits 135 and 155 as described above, must be formed from a pair of inverters, instead of using a single transistor topology as described above. Specifically, the rising-edge loop keeper circuit is formed by inverter 220, and NFET 225 has been replaced by an inverter 525. This allows the circuit keeper 135 to retain either a logical "1" or a logical "0" and does not require the reset signal on PFET 230 to remain active. Likewise, PFET 265 has been replaced by an inverter 565. Since "A" and "A'" are pulsed, the reset signals "B" and "B'" will also be pulsed. This can be seen in the timing diagram 501 at 580 and 590.

To prevent a tri-state output in a buffer employing pulse stage 510, the buffer 285 in the output stage 115 is replaced with two inverters 285(1) and 285(2). Since there is no longer a single input 112 for the buffer 285 to draw its signal from, the embodiment 500 instead utilizes a keeper circuit on the output 117. Specifically the inverters 285(1) and 285(2) are arranged so that the input of inverter 285(2) is connected to the output 117 and the output of inverter 285(2) is connected to the input of inverter 285(1). The output of inverter 285(1) is connected back to the output 117. Thus, the two inverters 285(1) and 285(2) serve to keep the last value asserted by the FETs 275 and 280. The inverters 285(1), 285(2) are sufficiently weak so as not to override the FET 275, 280 output. In another embodiment buffer 285 could be driven by a set-reset latch which is in turn driven by pulse inputs 112(1) and 112(2).

FIGS. 4a and 4b illustrate a schematic and timing diagram 601 for a pulse-in-pulse-out (PIPO) buffer 600. FIGS. 4a and 4b illustrate the PIPO buffer 600 in a similar manner as FIGS. 3a, and 3b, including the use and identity of signals A–F and A'–E'. Similar to PILO buffer 500, PIPO buffer 600 receives a positive and negative pulse signals "A", "A'", but instead of combining the input signals "A" and "A'" into a single signal "F", buffer 600 retains the pulse formatting and outputs two signals, "F" and "F'" corresponding to the positive and negative pulse inputs "A" and "A'" respectively.

PIPO buffer 600 employs the same pulse stage 510 as the PILO buffer 500 illustrated in FIG. 3a above. The output stage 115, however has been modified to generate the pulse outputs "F" and "F'". Since there are two separate outputs, "F", "F'", the output stage 115 is split into two transistor pairs 605, 607. Each transistor pair operates similarly to the output stage 115 described with respect to the LILO buffer 200 in FIG. 2. One major difference is that transistor pair 605 contains the large PFET 275, while transistor pair 607 includes the large NFET 280, which were previously coupled together to output the level output "F".

Large PFET 275 still receives the pulse from the first circuit's NAND gate 205 at its gate, and is coupled to a supply representing a logical "1" at its source. PFET 275 has its drain coupled to the source of a small NFET 680. The junction between PFET 275 and NFET 680 also serves as the output 117(1), i.e., the positive pulse output "F". This output is also coupled to a keeper circuit formed from a first inverter 285(1) and a second inverter 285(2). Inverter 285(1) receives input from output 117(1) and supplies the inverted signal to inverter 285(2), which in turn supplies the double-inverted signal back onto output 117(1), thus holding the output when the transistor pair 605 enters a tri-state mode. One example of when the transistor pair 605 enters tri-state mode is marked by line 630 on timing diagram 601.

Returning to the transistor pair 605, NFET 680 has its drain connected to ground, and its gate is coupled to a line 620. Line 620 is coupled to inverter 255, and receives a pulse signal "CC'" corresponding to a buffered version of "C". Pulse signal "CC'" shuts the positive pulse output "F" off. However, in order to conserve energy, and relying on the fact that in a pulse communication system the falling edge of a positive pulse is typically not used, NFET 680 may be made very small. By making NFET 680 small, less power is consumed, and the falling edge has a larger transition time, as shown at 640 in timing diagram 601. However, as noted above, the system does not use the falling edge of the output "F" so a slow falling edge 640 is acceptable. Driving NFET 680 directly from "C'" would slow down the critical path. Since NFET 680 is not critical, it is instead driven by "CC'" which is generated from "C'" without adding load to "C'".

Transistor pair 607 is configured in a similar manner. Large NFET 280 still receives the pulse from the second circuit's NOR gate 245 at its gate, and is grounded at its drain. NEFT 280 has its source coupled to the drain of a small PFET 675. The junction between NFET 280 and PFET 675 also serves as the output 117(2), i.e., the negative pulse output "F'". This output is also coupled to a keeper circuit formed from a first inverter 285(3) and a second inverter 285(4). Inverter 285(3) receives input from output 117(2) and outputs the inverted signal to inverter 285(4), which in turn supplies the double-inverted signal back onto output 117(2), thus holding the output when the transistor pair 607 enters a tri-state mode. One example of when the transistor pair 607 enters tri-state mode is marked by line 650 on timing diagram 601.

Returning to the transistor pair 607, PFET 675 has its source coupled to a supply that is representative of a logical "1", and its gate is coupled to a line 610. Line 610 is coupled to inverter 210, and receives a pulse signal "CC" corresponding to a buffered version of "C". Pulse signal "CC" shuts the negative pulse output "F'" off. However, in order to conserve energy, and relying on the fact that in a pulse communication system the rising edge of a negative pulse is typically not used, PFET 675 may be made very small. By making PFET 675 small, less power is consumed, and the rising edge has a larger transition time, as shown at 660 in timing diagram 601. As noted above, the system does not use the rising edge of the output "F'" and so a slow falling edge 660 is acceptable. Driving PFET 675 directly from "C" would slow down the critical path. Since PFET 675 is not critical, it is instead driven by "CC" which is generated from "C" without adding load to "C'".

FIGS. 5a and 5b illustrate a schematic and timing diagram for a level-in-pulse-out (LIPO) buffer 700. LIPO buffer 700 performs the opposite function of PILO buffer 500. LIPO buffer 700 receives a level input "F" and splits the data into a positive and negative pulse output "F" and "F'" respectively. Buffer 700 comprises a pulse stage arrangement similar to the pulse stage illustrated in FIG. 2. This pulse stage is combined with the output stage 115 illustrated in FIG. 4a. In order to combine these two stages, minor changes have also been made. As discussed with respect to the PILO buffer 500 in FIG. 3a, the rising-edge loop keeper circuit 135 and falling-edge loop keeper circuit 155 have been modified to substitute the respective FETs 225, 265 with a second inverter 525, 565. Such a replacement allows the keeper circuits 135, 155 to hold either a logical "1" or a logical "0" and does not rely on the reset signal "B" remaining active. While this modification is not necessary, it is presented as an alternative to the structure discussed in FIG. 2. The second minor modification to the pulse stage 115 includes the addition of lines 610 and 620 as discussed in FIG. 4a. These lines are included to allow the output stage to produce the separate positive and negative pulse outputs "F" and "F'".

As noted above, a complement reset buffer is suitable for applications requiring speed, efficiency, and the ability to handle long-wire distances. Within a microprocessor, this typically equates to signal distribution grids. Since these buffers are both fast and do not require synchronous operation, they may be advantageously used to speed up clock distribution while reducing clock skew in an integrated circuit, or may be used to decrease access times for cache memory (i.e. wires such as L2 or L3 routes.) Additionally, the buffer may advantageously use its large amplification to drive phase lock loop (PLL) outputs, construct off chip drivers (OCD), amplifiers and other large loads.

B. Complement Reset Latch

As described in detail above, buffers or repeaters are advantageously used along wire paths to regenerate a degrading signal or to maintain fast transition times. In high-speed synchronous integrated circuits that operate at gigahertz clock cycle frequencies, such as microprocessors, clock cycle periods are correspondingly short. In some cases, even with excellent performing buffers and careful wire design, a signal path is too long for the signal to propagate between circuit elements during one clock cycle of period τ. Pipelining of a long wire or cross-chip interconnect is needed to preserve data integrity and meet timing constraints. Repeater latches include the functionality of buffers or repeaters and the state storage functionality of a latch. That is, a repeater latch can be used both to regenerate a propagating signal and to hold the output signal at a stored value.

Figure 7:
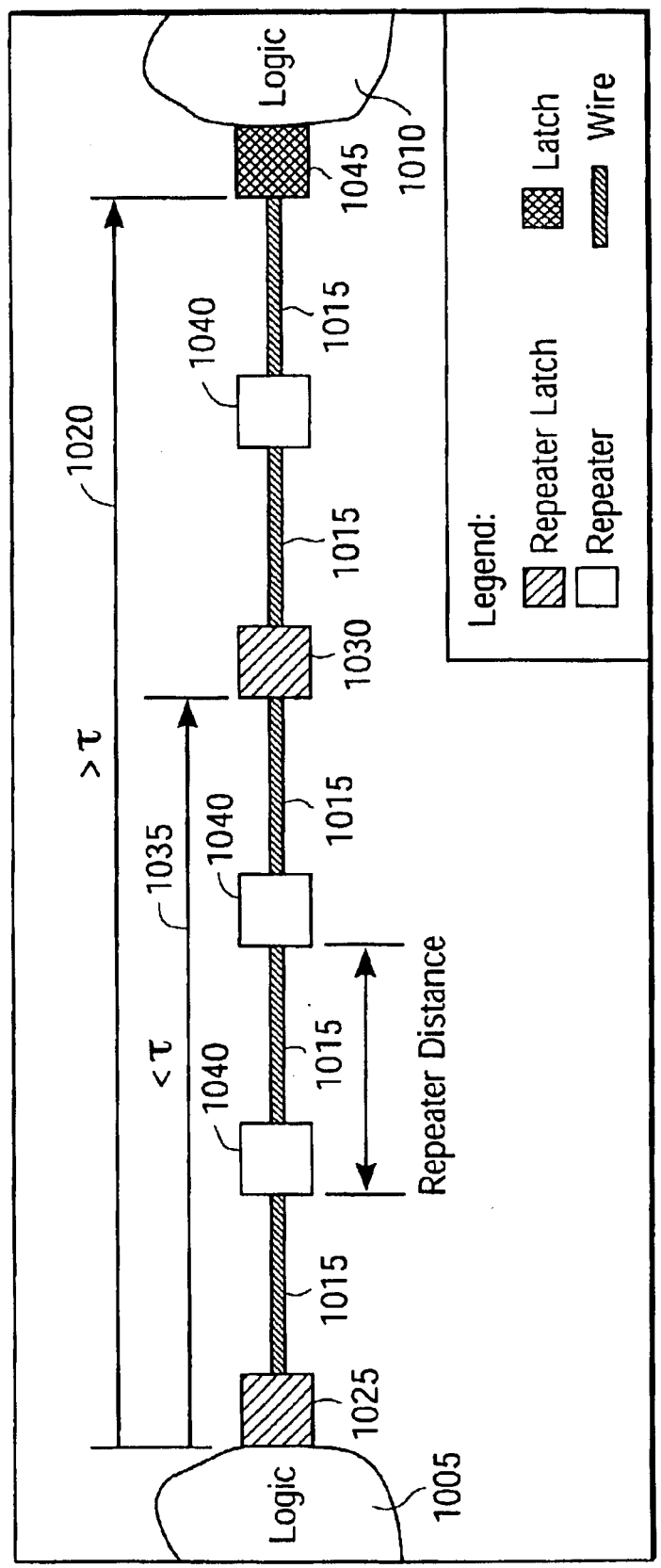
FIG. 7 illustrates data pipelining in a long wire path using repeater latches.

FIG. 7 illustrates data pipelining in a long wire path using repeater latches. In the illustration, first logic circuit 1005 is shown coupled to second logic circuit 1010 by wire segments 1015. Data must travel distance 1020 to propagate from first logic circuit 1005 to second logic circuit 1010. Because the propagation time over this distance 1020 is greater than clock cycle period τ, first repeater latch 1025 and second repeater latch 1030 are inserted in the signal path to meet the timing constraints imposed by the clock cycle period. First repeater latch 1025 and second repeater latch 1030 are spaced a distance 1035 apart. Distance 1035 is traversed in less than clock cycle period τ, so data provided as output of first repeater latch 1025 can arrive at second repeater latch 1025 during one clock cycle. Second repeater latch 1025 stores the current value of the data. In the next clock cycle, second repeater 1025 provides the data to general logic latch 1045. General logic latch 1045 can then hold the data for use by second logic circuit 1010. General logic latch 1045 may also be placed after some of the circuits within second logic circuit 1010, again subject to meeting timing constraints. In addition to first repeater latch 1025 and second repeater latch 1030, repeaters 1040 can be placed in the signal path to further enhance data transmission and reduce noise problems.

Embodiments of the complement reset latch integrate data latch functionality into the complement reset buffers described above. The integrated buffer or repeater latch has several advantageous features. There is no latch insertion delay because the critical paths of the complement reset buffer are unaffected by the latch transistors. State elements are not added to the critical path or coupled to critical path nodes. Further, clock load is approximately 10 times smaller than a conventional repeater latch. A conventional repeater latch includes clocking devices in series with the input FETs, which causes significant delay and loading. Complement reset latches allow for efficient design of cross-chip paths. Because the complement reset latch is built onto a complement reset buffer, complement reset buffers can be easily replaced with complement reset latches where needed to meet timing constraints.

Figure 8:
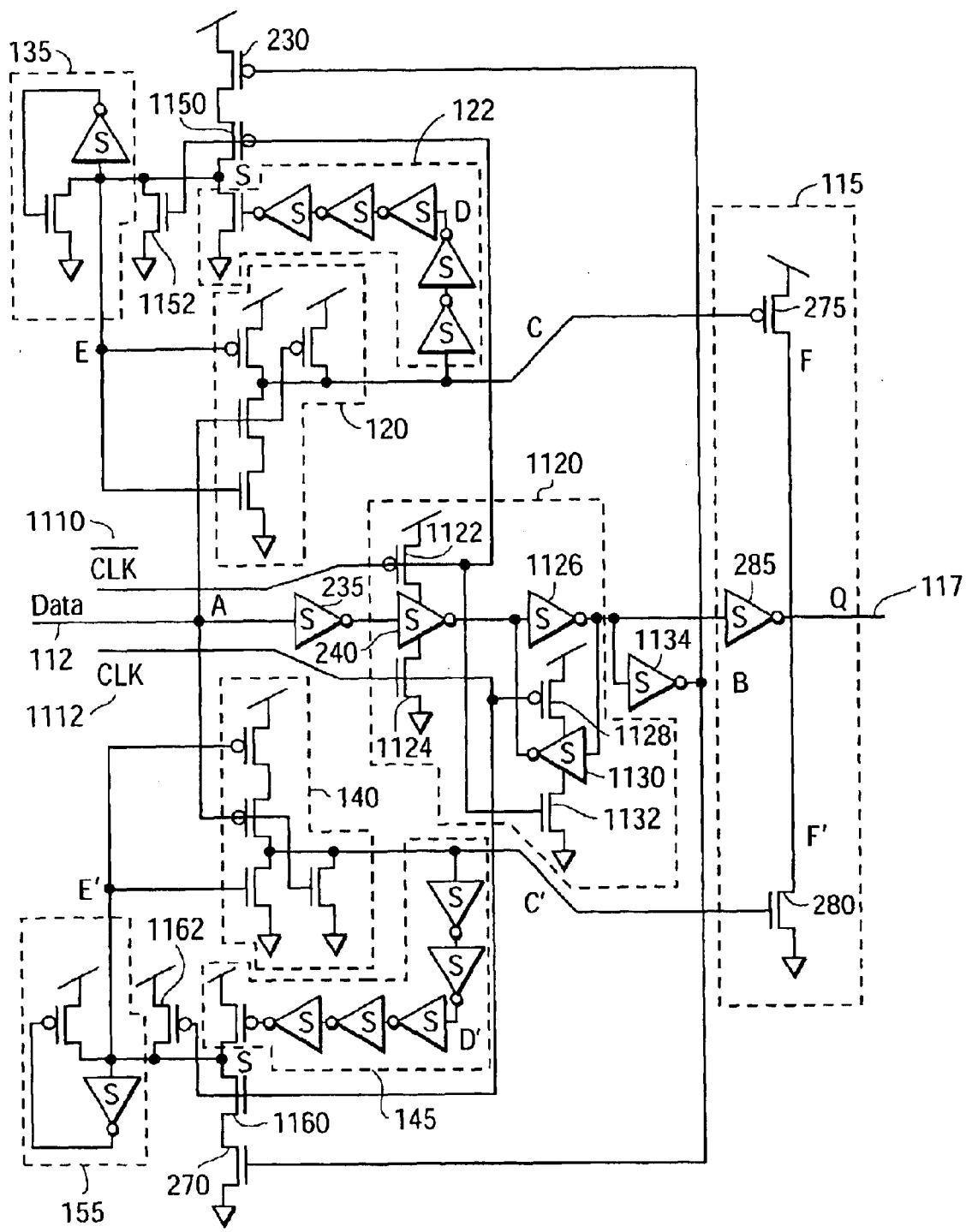
FIG. 8 is a schematic diagram of one embodiment of a level-in-level-out latch.

Referring now to FIG. 8, there is shown a schematic diagram of one embodiment of a level-in-level-out latch. In this embodiment, a complement reset latch is constructed in a level-in-level-out complement reset buffer as described above. In addition to the structure described above for the corresponding complement reset buffer, system clock signals CLK' 1110 and CLK 1112 are provided to control state element 1120. CLK' 1110 and CLK 1112 are complementary signals in the sense that they are inversions of each other. It is to be understood that when reference is made to a particular state of, for example, CLK 1112, then CLK' 1110 concurrently has a complementary state. State element 1120 allows for input data 112 to be selectively latched and held at output Q 117. CLK' 1110 and CLK 1112 are also used to gate the pulse chains that control the high-speed data 112 to Q 117 paths. Specifically, PFET 1150 and NFET 1152 form a rising edge gating circuit that selectively disables the rising edge pulse generator. Similarly, NFET 1160 and PFET 1162 form a falling edge gating that selectively disables the falling edge pulse generator 140. The pulse generators are selectively disabled so that state element 1120 can latch data 112 and output Q 117 is not temporarily overridden by output stage 115 if data 112 has further transitions during the latch hold mode.

In this embodiment, the latch is transparent when CLK 1112 has a logical "1" value. In transparent mode, the latch operates like a repeater or buffer. That is, data 112 transitions are regenerated on output Q 117. Specifically, in response to a rising edge on data 112, rising edge pulse generator 120 functions as described above to provide a rising edge pulse to output stage 115. Similarly, responsive to a falling edge on data 112, falling edge pulse generator 140 functions to provide a falling edge pulse to output stage 115. As before, the complement reset technique is used to reset the pulse chains that control the data 112 to Q 117 path. Rising edge pulse generator 120 and falling edge pulse generator 140 are enabled when CLK 1112 has a logical "1" value. The gating of the pulse generators is now described in further detail. With respect to the falling edge, the gate of NFET 1160 is coupled to CLK 1112, thereby turning on NFET 1160. NFET 1160 has its source coupled to node E' and the drain of NFET 1160 is coupled to the source of NFET 270. The gate of NFET 270 is coupled to the output of inverter 1134, which forms part of the reset generator. PFET 1162 has its source coupled to a supply voltage that represents logical "1" and its drain coupled to node E'. The gate of PFET 1162 is also coupled to CLK 1112, thereby turning off PFET 1162. Because NFET 1160 is turned on and PFET 1162 is turned off, the falling edge pulse reset and falling edge loop keeper 155 prepare falling edge pulse generator 140 for the next falling edge of data 112.

Similarly, in transparent mode, rising edge pulse generator 120 is enabled. Specifically, the gate of PFET 1150 is coupled to CLK' 1110, thereby turning on PFET 1150. PFET 1150 has its drain coupled to node E and the source of PFET 1150 is coupled to the drain of PFET 230. The gate of PFET 230 is coupled to the output of inverter 1134. PFET 1150 gates PFET 230 by selectively controlling whether PFET 230 is able to pull node E to logical "1" responsive to the reset signal provided by inverter 1134. NFET 1152 has its source coupled to node E and its drain coupled to ground as representative of logical "0." The gate of NFET 1152 is also coupled to CLK' 1110, thereby turning off NFET 1152. Because PFET 1150 is turned on and NFET 1152 is turned off, the rising edge pulse reset 125 and rising edge loop keeper 135 prepares rising edge pulse generator 120 for the next falling edge of data 112.

In the illustrated embodiment, rising edge pulse generator 120 is an "N"-skewed NAND gate that is configured to respond quickly to a rising edge on data 112. Falling edge pulse generator 140 is a "P"-skewed NOR gate that is configured to respond quickly to a falling edge on data 112. Therefore, the critical paths favor quick transitions on data 112.

On a falling edge of CLK 1112, state element 1120 latches data 112. State element 1120 is advantageously integrated in the complement reset buffer without affecting the critical paths. State element 1120 is configured to latch data 112 after the quickly responding pulse generators have provided appropriate pulses to output stage 115. A "weak" inverter chain (comprising inverters 235, 240, 1126, and 285 respectively) is provided to slowly transfer data 112 to output Q 117 and to hold it there until overdriven by one of the FETs 275, 280 switching on. Although the pulse generators are disabled when CLK 112 is logical "0", the weak inverter chain would still propagate data 112 to output Q 117. Therefore, state element 1120 selectively disables the weak inverter chain and enables a feedback circuit to store the latched value of data 112. The feedback circuit comprises inverters 1126 and 1130.

More specifically, when CLK 1112 is logical "0," PFET 1122 and NFET 1124 are turned off. These devices are placed in series with the NFET and PFET devices that are internal to inverter 240. When PFET 1122 and NFET 1124 are turned off, inverter 240 is disabled, which breaks the weak inverter chain. Breaking the weak inverter chain prevents data 112 from propagating through to output Q 117. PFET 1128 and NFET 1132 are similarly placed in series with the NFET and PFET devices that are internal to inverter 130. PFET 1128 and NFET 1132 are turned on to enable inverter 1130 to provide feedback to the input of inverter 1126. Inverters 1126 and 1130 are therefore cross-coupled to store the state of output Q 117. When CLK 1112 becomes a logical "1," feedback inverter 1130 is disabled and inverter 240 is enabled.

Figure 9:
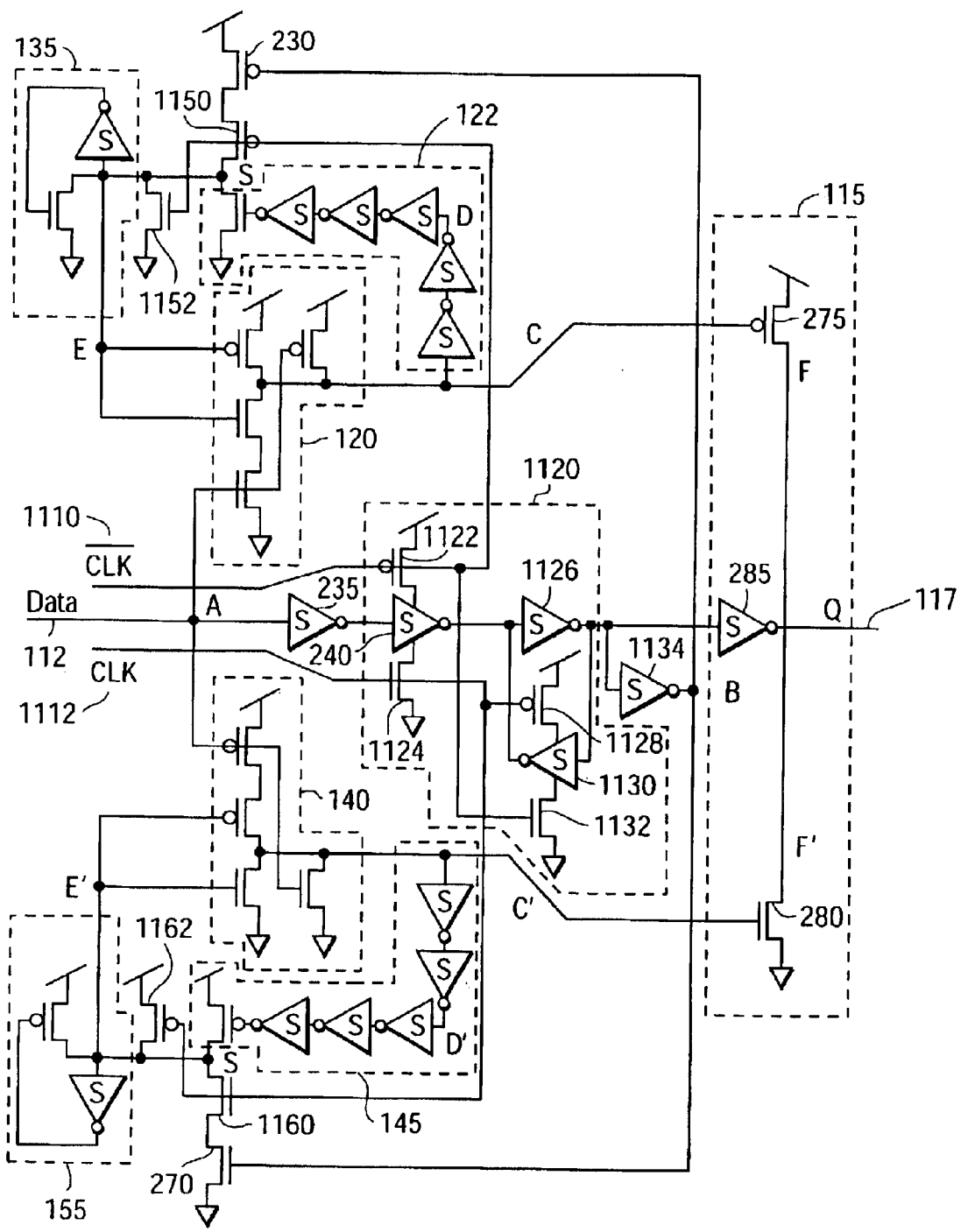
FIG. 9 is a schematic diagram of one embodiment of a level-in-level-out latch.

FIG. 9 is a schematic diagram of one embodiment of a level-in-level-out latch. In this embodiment, a complement reset latch is constructed in a level-in-level-out complement reset buffer as described above. When compared with the embodiment illustrated in FIG. 8, signal couplings to rising edge pulse generator 120 and to falling edge pulse generator 140 are reconfigured to provide a different critical path.

Rising edge pulse generator 120 is an "N"-skewed NAND gate that is configured to respond quickly to a rising edge on node E. Because node E is controlled by CLK' 1110, the latch is waiting on a pulse of CLK' 1110 to trigger output stage 115. Output Q 117 therefore changes value in response to a clock pulse. Similarly, falling edge pulse generator 140 is a "P"-skewed NOR gate that is configured to respond quickly to a falling edge on node E'. This configuration reduces CLK-to-Q delay compared to FIG. 8 at the expense of Data-to-Q delay in the latch transparent mode. It is suited to situations where the critical path must wait on the clock, but clock power is at a premium.

The latch functions similar to the embodiment described with respect to FIG. 8. State element 1120 allows for input data 112 to be selectively latched and held at output Q 117. CLK' 1110 and CLK 1112 are also used to gate the pulse chains that control the high-speed data 112 to Q 117 paths. Specifically, PFET 1150 and NFET 1152 selectively disable the rising edge pulse generator. Similarly, NFET 1160 and PFET 1162 selectively disable the falling edge pulse generator. The pulse generators are selectively disabled so that state element 1120 can latch data 112 and output Q 117 is not overridden by output stage 115.

Figure 10:
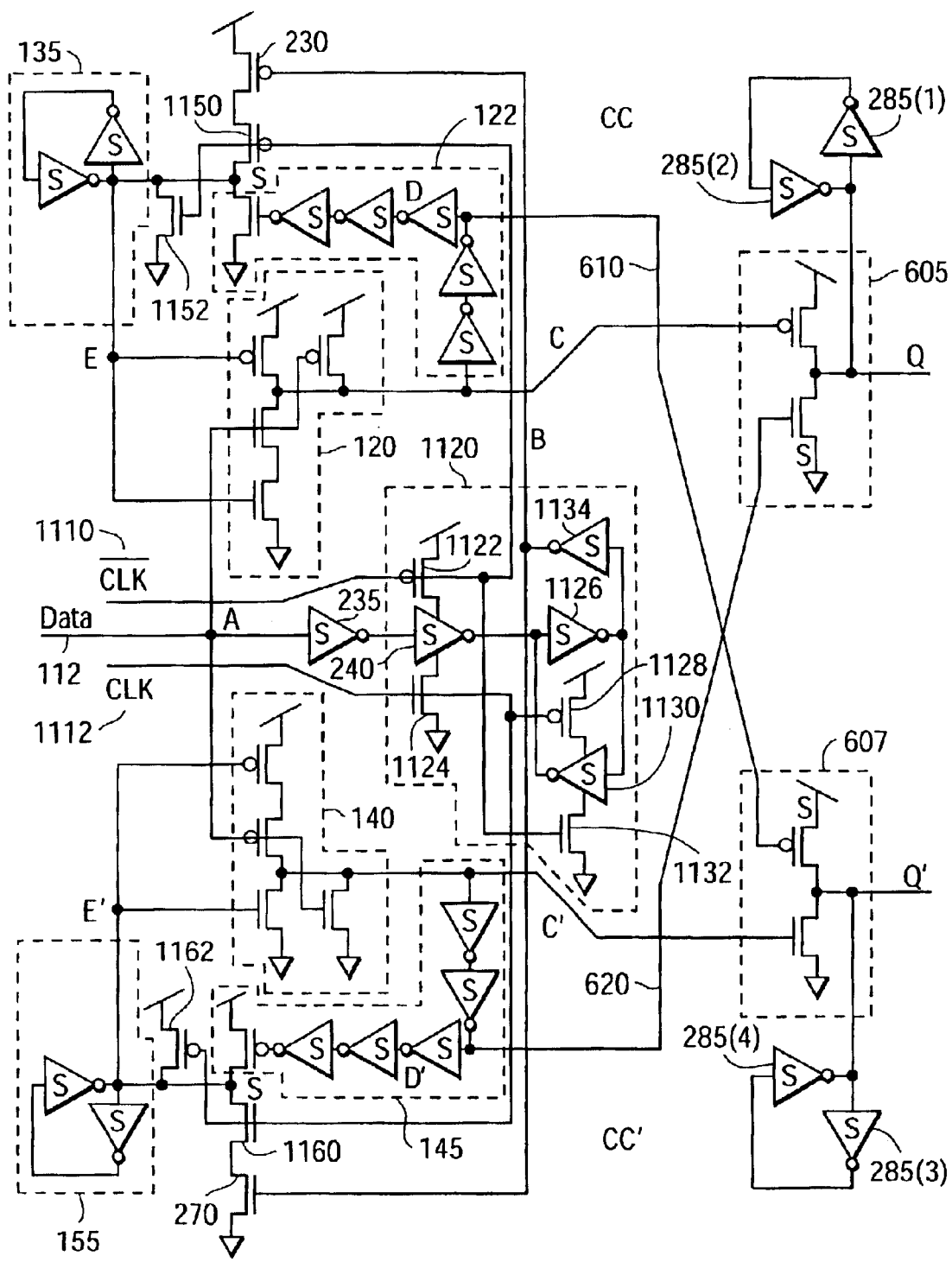
FIG. 10 is a schematic diagram of one embodiment of a level-in-pulse-out latch.

FIG. 10 is a schematic diagram of one embodiment of a level-in-pulse-out latch. In this embodiment, a complement reset latch is constructed in a level-in-pulse-out complement reset buffer as described above. To provide a Q and Q' pulse output, output stage 115 has been modified from the embodiments described with respect to FIGS. 8 and 9. Since there are two separate state outputs Q and Q', output stage 115 is split into two transistor pairs 605, 607. Each transistor pair operates similarly to the output stage 115 described with respect to the LILO buffer 200 in FIG. 2. One difference is that transistor pair 605 contains the large PFET 275, while transistor pair 607 includes the large NFET 280, which were previously coupled together to provide state output Q.

The behavior of the latch illustrated in FIG. 10 is similar to that of FIG. 8. State element 1120 allows for input data 112 to be selectively latched and held at outputs Q and Q'. CLK' 1110 and CLK 1112 are also used to gate the pulse chains that control the high-speed data 112 to Q 117 paths. Specifically, PFET 1150 and NFET 1152 selectively disable the rising edge pulse generator. Similarly, NFET 1160 and PFET 1162 selectively disable the falling edge pulse generator. The pulse generators are selectively disabled so that state element 1120 can latch data 112 and ensure that outputs Q and Q' are not overridden by output stage 605 or 607 if data 112 has further transitions during the latch mode.

In this embodiment, the latch is transparent when CLK 1112 has a logical "1" value. In transparent mode, the latch operates like a repeater or buffer. That is, data 112 transitions are regenerated pulses on outputs Q and Q'. Specifically, in response to a rising edge on data 112, rising edge pulse generator 120 functions as described above to provide a rising edge pulse to output stages 605, 607. Similarly, responsive to a falling edge on data 112, falling edge pulse generator 140 functions to provide a falling edge pulse to output stages 605, 607. As before, the complement reset technique is used to reset the pulse chains that control the data 112 to Q 117 critical path. Rising edge pulse generator 120 and falling edge pulse generator 140 are enabled when CLK 1112 has a logical "1" value. The gating of the pulse generators is now described in further detail. With respect to the falling edge, the gate of NFET 1160 is coupled to CLK 1112, thereby turning on NFET 1160. NFET 1160 has its source coupled to node E' and the drain of NFET 1160 is coupled to the source of NFET 270. The gate of NFET 270 is coupled to the output of inverter 1134, which forms part of the reset generator. PFET 1162 has its source coupled to logical "1" and its drain coupled to node E'. The gate of PFET 1162 is also coupled to CLK 1112, thereby turning off PFET 1162. Because NFET 1160 is turned on and PFET 1162 is turned off, the falling edge pulse reset 150 and falling edge loop keeper 155 prepares falling edge pulse generator 140 for the next falling edge of data 112.

On a falling edge of CLK 1112, state element 1120 latches data 112. State element 1120 is advantageously integrated in the complement reset buffer without affecting the critical paths. State element 1120 is configured to latch data 112 after the quickly responding pulse generators have provided appropriate pulses to output stages 605, 607. A "weak" inverter chain (comprising inverters 235, 240, and 1126 respectively) is provided to slowly transfer data 112 to the state element comprising inverters 1126 and 1130. State is held at the two outputs by two latches comprising inverters 285(1)-(4) until overdriven by the transistor pairs of output stage 605, 607.

Figure 11:
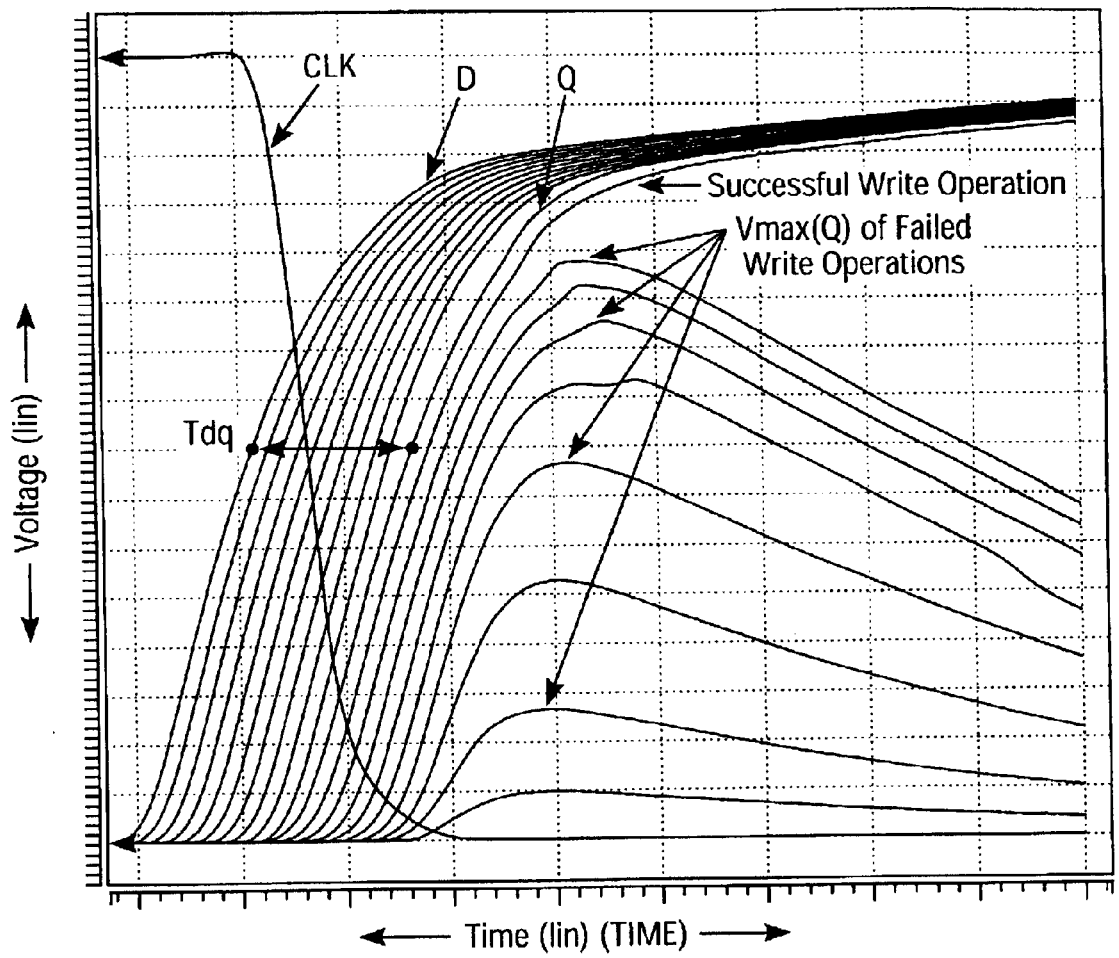
FIG. 11 is a chart illustrating setup and hold time evaluation for one embodiment of a complement reset latch.

FIG. 11 is a chart illustrating setup and hold time evaluation for one embodiment (e.g., FIG. 9) of a complement reset latch. As with conventional data latches, embodiments of complement reset latches need some setup and hold time of data versus clock to produce glitch-free output. FIG. 11 illustrates the behavior of output, Q, as the setup time of data, D, is varied versus the clock, CLK. Near marginal setup and hold time, a large output glitch occurs that slowly decays to the previous state. The decay time is very long; coincidentally it is nearly one clock cycle. The critical path almost completely switched the output, but the latch failed to setup. The latch, through inverter 285 (e.g., FIG. 9), slowly drives the output back to its previous state. For this reason, a complement reset latch is not best indicated for use as a short-pulse latch. A complement reset latch is suitable for use as a transparent latch or as a pulse latch with a pulse width of τ/2 (half a clock cycle). This is efficient for clock power and appropriate for pipeline latch applications.

C. Complement Reset Multiplexer Latch

Embodiments of the present invention integrate multiplexer functionality into a complement reset latch, which is described above. The integrated multiplexer has several advantageous features. Similar to the complement reset latch, there is no insertion delay for the latching functionality because the critical paths are unaffected by the latch transistors and only slightly affected by the critical path multiplexer transistors. A conventional multiplexer includes additional devices series-stacked with the input FETs to select between the input data signals. In one embodiment of the present invention, a multiplexer is integrated into the critical path of the complement reset latch without adding series-stacked select transistors, which cause significant delay and loading. Accordingly, clock load for an embodiment of the complement reset multiplexer latch is approximately 5 times smaller than a conventional latch.

Figure 12:
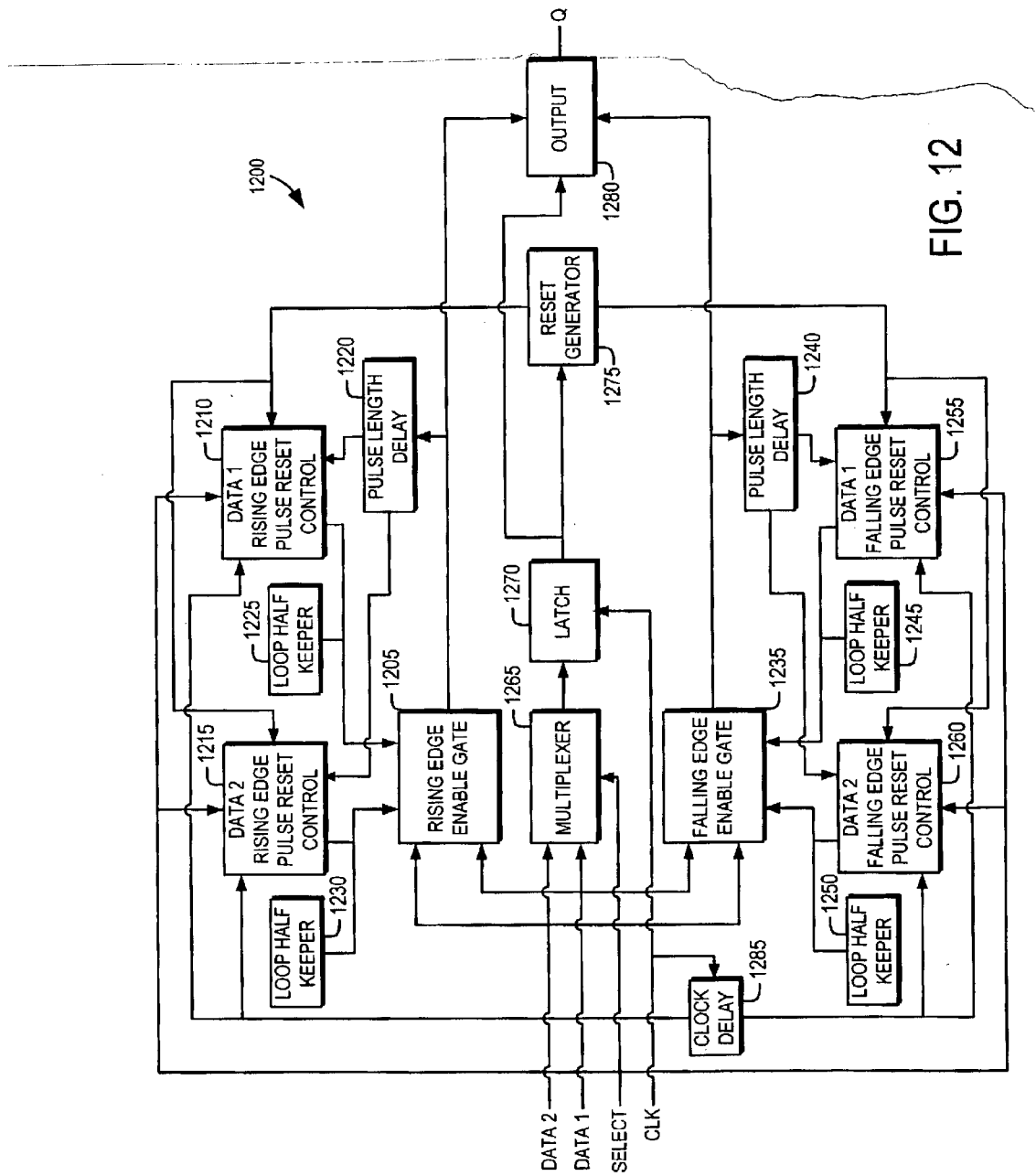
FIG. 12 is a high-level block diagram of a complement reset multiplexer latch according to one embodiment of the present invention.

Referring now to FIG. 12, there is shown a high-level block diagram of a complement reset multiplexer latch 1200 according to one embodiment of the present invention. The complement reset multiplexer latch 1200 includes a first input data signal DATA 1, a second input data signal DATA 2, a SELECT signal for controlling the multiplexer functions, and a clock (CLK) input for controlling the latch functions. The complement reset multiplexer latch 1200 also includes an output node Q. On the output node Q, transitions in the DATA 1 or DATA 2 signal are selectively regenerated responsive to the state of the SELECT signal. Furthermore, when the complement reset multiplexer latch 1200 is in a hold mode, the state stored by the latch is provided on the output node Q.

The complement reset multiplexer latch 1200 generally includes three functional portions: a first portion for reacting to the rising edges of the input data signals, a second portion for reacting to the falling edges of the input data signals, and a third portion for storing the state of the input signals. Each of the three portions includes multiplexer functionality to select between the input data signals DATA 1 and DATA 2. For the first portion, the state of the SELECT signal determines whether a rising edge on DATA 1 or DATA 2 triggers a transition on output node Q. Likewise, for the second portion, the state of the SELECT signal determines whether a falling edge on DATA 1 or DATA 2 triggers a transition on output node Q. For the third portion, the state of the SELECT signal determines which of DATA 1 or DATA 2 is latched responsive to the CLK signal.

The first portion includes a rising edge enable gate 1205, a DATA 1 rising edge pulse reset control 1210, a DATA 2 rising edge pulse reset control 1215, a pulse length delay 1220, and a two rising edge loop half keepers 1225, 1230. It is noted that the DATA 1 rising edge pulse reset control 1210 and the DATA 2 rising edge pulse reset control 1215 can also be referred to as first and second rising edge pulse controls. The rising edge enable gate 1205 receives the input data signals DATA 1 and DATA 2, and outputs a rising-edge pulse to the output 1280 when a rising edge is detected on one of the input signals DATA 1 or DATA 2. The rising edge enable gate 1205 is configured to react to a rising edge on one of the input signals DATA 1 or DATA 2 depending on the state of the SELECT signal. Specifically, when the SELECT signal has a logical "0" value, the rising edge enable gate 1205 responds to a rising edge on DATA 1. Likewise, when the SELECT signal has a logical "1" value, the rising edge enable gate 1205 responds to a rising edge on DATA 2. As with the complement reset latch described above, the input data to output node Q delay is the critical path of the complement reset multiplexer latch. Therefore, although there is some setup and/or hold time for the SELECT to output node Q path, this delay is non-critical.

The output of the rising edge enable gate 1205 is further coupled to the pulse length delay 1220. The pulse length delay 1220 is configured to loop the rising-edge pulse produced by the rising edge enable gate 1205 to the DATA 1 rising edge pulse reset control 1210 or the DATA 2 rising edge pulse control 1215 and then back to the rising edge enable gate 1205. Once the looped pulse is received, the rising edge enable gate 1205 stops providing the rising-edge pulse to the output 1280. The propagation delay through the pulse length delay 1220 determines the width of the rising-edge pulse, which therefore determines the duration of the signal driven by the output 1280 on output node Q.

The DATA 1 rising edge pulse reset control 1210 and the DATA 2 rising edge pulse reset control 1215 are configured to receive a reset signal from a reset generator 1275. Depending on the logical value of the SELECT signal, the reset signal triggers the DATA 1 rising edge pulse reset control 1210 or the DATA 2 rising edge pulse reset control 1215 enable the rising edge enable gate 1205 to react to a subsequent rising edge on the data input selected by the logical value of the SELECT signal. For example, if the SELECT signal has a logical "0" value, the DATA 1 rising edge pulse reset control 1210 conditions the rising edge enable gate 1205 to respond to a subsequent rising edge on DATA 1. Likewise, if the SELECT signal has a logical "1" value, the DATA 2 rising edge pulse reset control 1215 conditions the rising edge enable gate 1205 to respond to a subsequent rising edge on DATA 2.

For the first portion, the reset generator 1275 is configured to wait for a falling edge on the data input selected by the logical value of the SELECT signal before generating the reset signal for the DATA 1 rising edge pulse reset control 1210 or the DATA 2 rising edge pulse reset control 1215. The reset generator 1275 advantageously uses the complement of the selected data input (i.e., DATA 1 or DATA 2) to ensure that the rising edge enable gate 1205 is not reset until the selected data input has a logical "0" value. By using the complement to trigger a reset, a complement reset multiplexer latch avoids requiring the use of the CLK signal or other external controls to implement the reset.

The second portion acts as the complement of the first portion and is configured to react to the falling edge of selected data input. The general operation and structure of the second portion is similar to the operation and structure of the first portion. The second portion includes a falling edge enable gate 1235, a DATA 1 falling edge pulse reset control 1255, a DATA 2 falling edge pulse reset control 1260, a pulse length delay 1240, and two falling edge half loop keepers 1245, 1250. It is noted that the DATA 1 falling edge pulse reset control 1255 and the DATA 2 falling edge pulse reset control 1260 can also be referred to as first and second falling edge pulse controls.

The falling edge enable gate 1235 receives the input data signals DATA 1 and DATA 2, and outputs a falling-edge pulse to the output 1280 when a falling edge is detected on one of the input signals DATA 1 or DATA 2. The falling edge enable gate 1235 is configured to react to a falling edge on one of the input signals DATA 1 or DATA 2 depending on the state of the SELECT signal. Specifically, when the SELECT signal has a logical "0" value, the falling edge enable gate 1235 responds to a falling edge on DATA 1. Likewise, when the SELECT signal has a logical "1" value, the falling edge enable gate 1235 responds to a falling edge on DATA 2.

The output of the falling edge enable gate 1235 is further coupled to the pulse length delay 1240. The pulse length delay 1240 is configured to loop the falling-edge pulse produced by the falling edge enable gate 1235 to the DATA 1 falling edge pulse reset control 1255 or the DATA 2 falling edge pulse reset control 1260 and then back to the falling edge enable gate 1235. Once the looped pulse is received, the falling edge enable gate 1235 stops providing the falling-edge pulse to the output 1280. The propagation delay through the pulse length delay 1240 determines the width of the falling-edge pulse, which therefore determines the duration of the signal driven by the output 1280 on output node Q.

The DATA 1 falling edge pulse reset control 1255 and the DATA 2 falling edge pulse reset control 1260 are configured to receive a reset signal from the reset generator 1275. Depending on the logical value of the SELECT signal, the reset signal triggers the DATA 1 falling edge pulse reset control 1255 or the DATA 2 falling edge pulse reset control 1260 to enable the falling edge enable gate 1235 to react to a subsequent falling edge on the data input selected by the logical value of the SELECT signal. For example, if the SELECT signal has a logical "0" value, the DATA 1 falling edge pulse reset control 1255 conditions the falling edge enable gate 1235 to respond to a subsequent falling edge on DATA 1. Likewise, if the SELECT signal has a logical "1" value, the second falling edge pulse reset control 1260 conditions the falling edge enable gate 1235 to respond to a subsequent falling edge on DATA 2.

For the second portion, the reset generator 1275 is configured to wait for a rising edge on the data input selected by the logical value of the SELECT signal before generating the reset signal for the DATA 1 falling edge pulse reset control 1255 or the second falling edge pulse reset control 1260. The reset generator 1275 advantageously uses the complement of the selected data input (i.e., DATA 1 or DATA 2) to ensure that the falling edge enable gate 1235 is not reset until the selected data input has a logical "1" value. One skilled in the art will recognize that the operation of the complement reset multiplexer latch is similar to the complement reset latch and the complement reset buffer, which are described in further detail above.

The third portion includes a multiplexer 1265 and a latch 1270. The multiplexer 1265 receives the input data signals DATA 1 and DATA 2 and the SELECT signal. Responsive to the logical value of the SELECT signal, the multiplexer 1265 provides the value of DATA 1 or DATA 2 as input to the latch 1270. The latch 1270 allows for the selected input data to be conditionally stored and held at output node Q. In transparent mode, the latch 1270 passes the data input selected by the multiplexer 1265 to the output node Q. Due to the high-speed input data to output node Q path, however, the output 1280 overdrives the relatively weak transistors of the latch 1270.

In latch hold mode, the latch 1270 stores the selected data input provided by the multiplexer 1265 after the quickly responding rising and/or falling edge enable gates 1205, 1235 have provided appropriate pulses to the output 1280. As similarly described in further detail above, the CLK signal (and a complementary CLK' signal) are also used to gate the reset loops to disable the rising and/or falling edge enable gates 1205, 1235. The rising and/or falling edge enable gates 1205, 1235 are selectively disabled by the pulse reset controls 1210, 1215, 1255, 1260 so that the latch 1270 can latch the selected data input and output node Q is not temporarily overridden by the output 1280 if the selected data input has further transitions during the latch hold mode.

Figure 13:
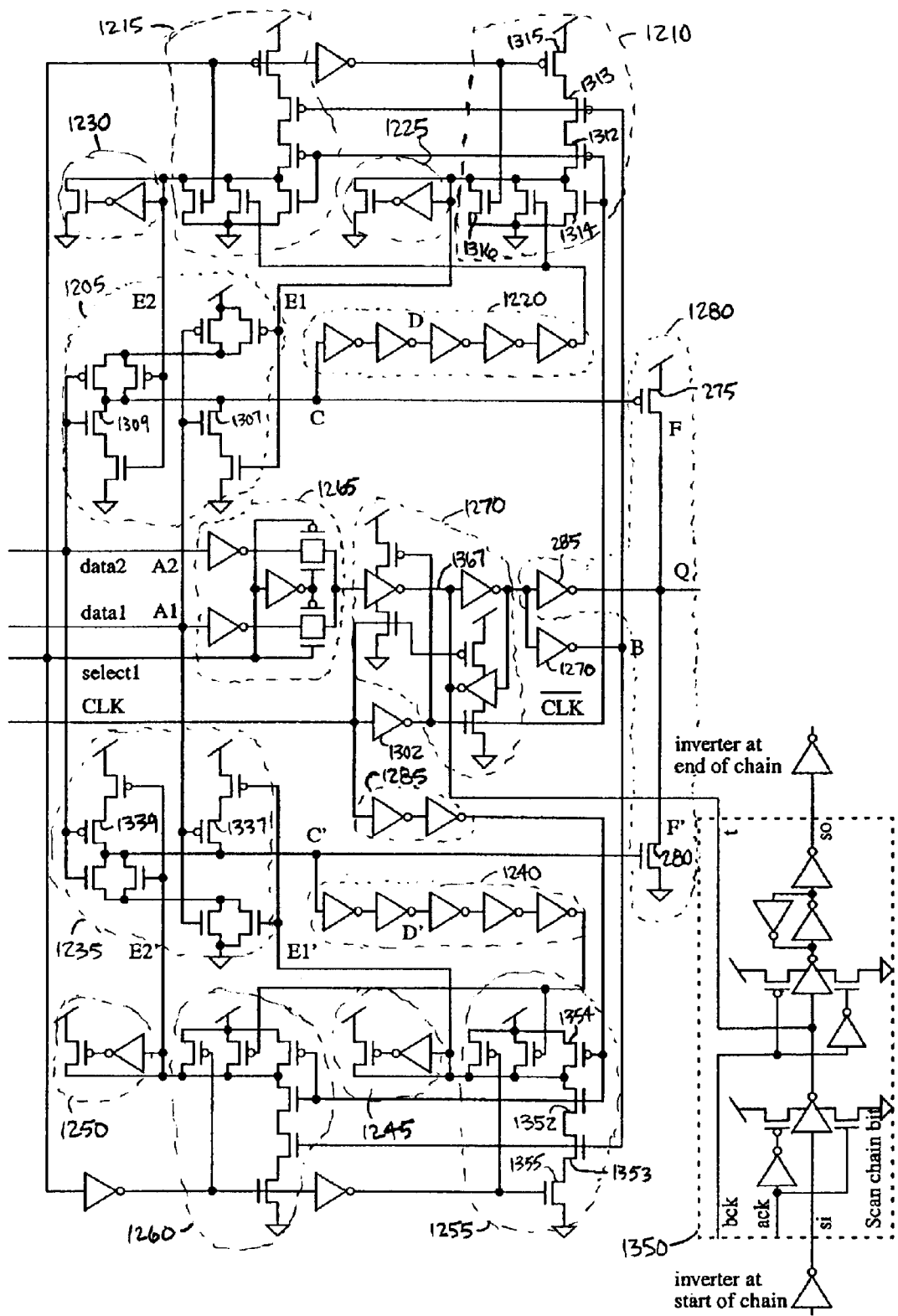
FIG. 13 is schematic diagram of a level-in-level-out multiplexer latch according to one embodiment of the present invention.

FIG. 13 is schematic diagram of a level-in-level-out multiplexer latch according to one embodiment of the present invention. The illustrated embodiment includes specific structure for each of the elements of the complement reset multiplexer latch 1200. For the non-critical path, the input data signals DATA 1 and DATA 2 are provided to a multiplexer 1265 of conventional design having low capacitance. The multiplexer 1265 also receives the SELECT signal (identified as select1 in FIG. 13). Depending on whether the SELECT signal has a logical "0" or logical "1" value, the multiplexer 1265 provides DATA 1 or DATA 2 respectively to the input of the latch 1270. One skilled in the art will note that the construction of the latch 1270 is similar to the state element 1120 described above. In this embodiment, however, an inverter 1302 is used to generate the CLK' signal internally. The output of the latch 1270 is provided to the weak buffer 285, which is coupled to the output node Q.

In the illustrated embodiment, when CLK has a logical "1" value, the latch 1270 is in a transparent mode. In the transparent mode, the complement reset multiplexer latch functions like a buffer with an integrated multiplexer. That is, transitions in DATA1 or DATA2 are selectively regenerated on output node Q. As before, the complement reset technique is used to reset the pulse chains that control the DATA1 and DATA2 to output node Q path. The rising and falling edge enable gates 1205, 1235 are enabled when the CLK signal has a logical "1" value.

The gating of the rising and falling edge enable gates 1205, 1235 is now described in further detail. With respect to the falling edge enable gate 1235, the gate of NFET 1352 is coupled to the CLK signal, thereby turning on NFET 1352. NFET 1352 has its source coupled to node E1' and the drain of NFET 1352 is coupled to the source of NFET 1353. The gate of NFET 1353 is coupled to node B, which is the output of the reset generator 1275. PFET 1354 has its source coupled to a supply voltage that represents logical "1" and its drain coupled to node E1'. The gate of PFET 1354 is also coupled to the CLK signal, thereby turning off PFET 1354. Further, the SELECT signal is coupled to the gate of NFET 1355. When the SELECT signal has a logical "0" value, NFET 1355 is turned on. Because NFET 1352 is turned on, PFET 1354 is turned off, and NFET 1355 is turned on, the DATA 1 falling edge pulse reset control 1255 and DATA 1 falling edge loop keeper 1245 prepare the falling edge enable gate 1235 for the next falling edge of DATA 1. The DATA 2 falling edge pulse reset control 1260 is similarly gated responsive to the SELECT signal and the CLK signal to prepare the falling edge enable gate 1235 for the next falling edge of DATA 2.

Likewise, with respect to the rising edge enable gate 1205 in transparent mode, the gate of PFET 1312 is coupled to the CLK' signal, thereby turning on PFET 1312. PFET 1312 has its drain coupled to node E1 and the source of PFET 1312 is coupled to the drain of PFET 1313. The gate of PFET 1313 is coupled to the output of the reset generator 1275. PFET 1315 has its source coupled to a supply voltage and its drain coupled to the source of PFET 1313. PFET 1315 has is gate coupled to the SELECT signal. PFET 1312 and PFET 1315 gate PFET 1313 by selectively controlling whether PFET 1313 is able to pull node E1 to logical "1" responsive to the reset signal provided by the reset generator 1275.

More specifically, when the SELECT signal has a logical "0" value, PFET 1315 is turned on. Because PFET 1315 is turned on, NFET 1316 is turned off, the DATA 1 rising edge pulse reset control 1210 and DATA 1 rising edge loop half keeper 1225 prepare the rising edge enable gate 1205 for the next rising edge of DATA 1. The DATA 2 rising edge pulse reset control 1215 is similarly gated responsive to the SELECT signal and the CLK signal to prepare the rising edge enable gate 1205 for the next rising edge of DATA 2.

In the illustrated embodiment, the rising edge enable gate 1205 is an and-or-invert gate arrangement. It is noted that the rising edge enable gate 1205 it not limited to the illustrated and-or-invert arrangement and that other multiplexer organizations can be implemented. The SELECT signal controls the DATA 1 and DATA 2 rising edge pulse reset controls 1210, 1215 to implement the multiplexer functionality in conjunction with the rising edge enable gate 1205. The rising edge enable gate 1205 advantageously omits conventional'select transistors series-stacked onto critical paths C and C'.

For the rising edge critical path C, when the SELECT signal has a logical "0" value, the DATA 1 rising edge pulse reset control 1210 configures node E1 to have a logical "0" value. The rising edge loop half keeper 1225 is enabled to hold node E1 at a logical "0" value. When DATA 1 makes a rising edge transition, NFET 1307 switches on to generate a pulse on the gate of output PFET 275. The output 1280 then regenerates the DATA 1 signal on output node Q.

Similarly, when the SELECT signal has a logical "1" value, the DATA 2 rising edge pulse reset control 1215 configures node E2 to have a logical "0" value. The rising edge loop half keeper 1230 is enabled to hold node E2 at a logical "0" value. When DATA 2 makes a rising edge transition, NFET 1309 switches on to generate a pulse on the gate of output PFET 275. The output 1280 then regenerates the DATA 2 signal on output node Q.

For the falling edge critical path C', when the SELECT signal has a logical "0" value, the DATA 1 falling edge pulse reset control 1255 configures node E1' to have a logical "1" value. The falling edge loop half keeper 1245 is enabled to hold node E1' at a logical "1" value. When DATA 1 makes a falling edge transition, PFET 1337 switches on to generate a pulse on the gate of output NFET 280. The output 1280 then regenerates the DATA 2 signal on output node Q.

Similarly, when the SELECT signal has a logical "1" value, the DATA 2 falling edge pulse reset control 1260 configures node E2' to have a logical "1" value. The falling edge loop half keeper 1250 is enabled to hold node E2' at a logical "1" value. When DATA 2 makes a falling edge transition, PFET 1339 switches on to generate a pulse on the gate of output NFET 280. The output 1280 then regenerates the DATA 2 signal on output node Q.

Referring again to the non-critical path or third portion described above and with reference to FIG. 12, the integration of a conventional scan chain latch 1350 is now described. In one embodiment of the present invention, the scan chain latch 1350 includes bi-directional path "t" that is coupled to an internal latch node 1367. In this configuration, the latch 1270 and the scan chain latch 1350 are organized in a master/slave latch structure. That is, the latch 1270 can write its stored data to the scan chain latch 1350 and the scan chain latch 1350 can write its state into the latch 1270.

The scan chain latch 1350 can be advantageously used to implement design for test features. Specifically, bit sequences representing test vectors can be clocked into the scan chain latch 1350. The state of the scan chain latch 1350 can then be written to the latch 1270 for generating a predetermined output on output node Q. When the ACK signal is disabled, the logical value present on the internal latch node 1367 is written to the scan chain latch 1350 when the BCK signal is active. When the ACK signal is active the scan chain latch 1350 writes its stored state to the internal latch node 1367 when the BCK signal is disabled. It is noted that the speed of the latch 1270 and the scan chain latch 1350 devices determine the scan frequency.

One advantage of the illustrated embodiment of the present invention is that output buffer 285 enables the output node Q to follow the target data instead of producing transients as test vectors are loaded. This enables a faster test having lower power dissipation and less noise. Because the output buffer 285 is weak (i.e., small), however, it takes time for data on the non-critical path to settle to the correct voltage on output node Q due to noise or other coupling issues with other wires. In one embodiment of the present invention, the complement reset multiplexer latch includes repeater functionality so the output node Q is typically connected to a long wire path. Long wire paths generally drive non-noise sensitive circuits and the paths are spaced so as to reduce noise.

In one embodiment of the present invention, a complement reset multiplexer can be implemented by omitting or removing the latch 1270, associated CLK signals, and devices for DATA 1 including 1312, 1314, 1352, 1354 (and similarly for DATA 2), as desired. In this case, a complement reset buffer is produced which has an integrated low insertion delay multiplexer. In further embodiments of the present invention, the complement reset multiplexer latch can also be based on other types of complement reset latches described herein. For example, the multiplexer functionality can be integrated into the level-in-pulse-out (LIPO), pulse-in-level-out (PILO), and pulse-in-pulse-out (PIPO) configurations of both the transparent and pulse varieties. Although a 2-input multiplexer function has been described, in another embodiment of the present invention, one skilled in the art will appreciate that additional multiplexer inputs can be added.

What is claimed is:

1. A multiplexer circuit for receiving a first input data signal, a second input data signal, and a select signal and for providing an output signal, the multiplexer comprising:

a first rising edge pulse reset control coupled to receive the select signal and configured to select the first input data signal responsive to the select signal state;

a second rising edge pulse reset control coupled to receive the select signal and configured to select the second input data signal responsive to the select signal state;

a rising edge enable gate coupled to receive at least one of the first input data signal and the second input data signal and configured to generate a first pulse responsive to a first transition edge of the selected first or second input data signal;

a first pulse length delay coupled to receive the first pulse from the rising edge enable gate and configured to generate a first pulse loop signal to deactivate the rising edge enable gate responsive to the first pulse;

a first falling edge pulse reset control coupled to receive the select signal and configured to select the first input data signal responsive to the select signal state;

a second falling edge pulse reset control coupled to receive the select signal and configured to select the second input data signal responsive to the select signal state;

a falling edge enable gate coupled to receive the first input data signal and the second input data signal and configured to generate a second pulse responsive to a second transition edge of the selected first or second input data signal;

a second pulse length delay coupled to receive the second pulse from the falling edge enable gate and configured to generate a second pulse loop signal to deactivate the falling edge enable gate responsive to the second pulse; and an output coupled to receive the first and second pulses and configured to produce an output of first logic value for the duration of the first pulse, and of second logic value for the duration of the second pulse as the output signal from the multiplexer circuit.

2. The multiplexer circuit of claim 1 further comprising:

a first loop keeper coupled to intercept the first pulse loop signal between the first pulse length delay and the rising edge enable gate and configured to deactivate the rising edge enable gate responsive to receiving the first pulse loop signal, thereby blocking subsequent pulse loop signals from reaching the rising edge enable gate; and a reset generator coupled to receive the selected first or second input signal and to output a first reset signal responsive to a falling edge of the selected input signal.

3. The multiplexer circuit of claim 1 further comprising:

a second loop keeper circuit coupled to receive the second pulse loop signal from second pulse length delay and configured to deactivate the falling edge enable gate responsive to receiving the second pulse loop signal, thereby blocking subsequent pulse loop front reaching the falling edge enable gate; and a reset generator coupled to receive the selected first or second input signal and to output a second reset signal responsive to a rising edge of the input signal.

4. The multiplexer circuit of claim 1 wherein the output comprises a keeper circuit configured to hold the output signal constant between the first and the second pulses.

5. The multiplexer circuit of claim 1 wherein the rising edge enable gate, the falling edge enable gate, and the output are configured to be large devices.

6. The multiplexer circuit of claim 1 wherein the width of the first pulse is determined by the amount of delay between the rising edge enable gate producing the first pulse and the first pulse length delay producing the first pulse loop signal.

7. The multiplexer circuit of claim 1 wherein the width of the second pulse is determined by the amount of delay between the falling edge enable gate producing the first pulse and the second pulse length delay producing the second pulse loop signal.

8. The multiplexer circuit of claim 1 wherein the rising edge enable gate and the falling edge enable gate are configured to receive a level signal from the first input data signal and the second input data signal, and the output is configured to generate a level signal as the output signal.

9. A multiplexer circuit for receiving a first input data signal, a second input data signal, a select signal, and a clock signal and for providing an output signal, the multiplexer comprising:
   a multiplexer coupled to the first and the second input data signal and configured to produce a selected input data signal responsive to the select signal;
   a complement reset latch including a latch element coupled to receive the selected input data signal from the multiplexer and configured to produce a state output responsive to the clock signal;
   a rising edge enable gate configured to generate a first pulse responsive to a rising edge of the selected input data signal;
   a falling edge enable gate configured to generate a second pulse responsive to a falling edge of the selected input data signal; and
   an output coupled to receive the first and second pulses and configured to produce one of an output of first logic value for the duration of the first pulse, an output of a second logic value for the duration of the second pulse, and an output of the state output as the output signal from the multiplexer circuit.

10. The multiplexer of claim 9 wherein the latch element includes cross-coupled inverters configured to store the state output.

11. The multiplexer of claim 9 wherein the latch element is further configured to latch the selected input data signal responsive to a transition of the clock signal.

12. The multiplexer of claim 9 wherein the latch element is further configured to latch the selected input data signal responsive to a falling edge of the clock signal.

13. The multiplexer of claim 9 further comprising:
   a first rising edge pulse reset control coupled to receive the select signal and configured to select the first input data signal responsive to a first select signal state; and
   a second rising edge pulse reset control coupled to receive the select signal and configured to select the second input data signal responsive to a second select signal state.

14. The multiplexer of claim 9 further comprising:
   a first falling edge pulse reset control coupled to receive the select signal and configured to select the first input data signal responsive to a first select signal state; and
   a second falling edge pulse reset control coupled to receive the select signal and configured to select the second input data signal responsive to a second select signal state.

15. The latch of claim 9 wherein the latch element includes small devices for reducing load on the clock signal.

16. A multiplexer circuit comprising:
   means for selecting one of the first and the second input data signals responsive to a select signal to produce a selected input signal;
   means for turning on a pulse signal responsive to a transition in at least one of the selected input signal and the clock signal; and
   responsive to a transition in the clock signal, means for disabling the pulse signal and means for holding the output signal at a stored value.

17. The multiplexer of claim 16 wherein the means for holding the output signal includes small devices for reducing load on the clock signal.

18. The multiplexer of claim 16 wherein the first and the second input data signals comprise level signals.

19. The multiplexer of claim 16 wherein the output signal comprises one of a level signal and a pulse signal.

20. A method for selecting and latching one of a first and a second input data signal to produce an output signal in relation to a clock signal, the method comprising:
   selecting one of the first and the second input data signals responsive to a select signal to produce a selected input signal;
   turning on a pulse signal responsive to a transition in at least one of the selected input signal and the clock signal; and
   responsive to a transition in the clock signal, disabling the pulse signal and holding the output signal at a stored value.

21. The method of claim 20 further comprising:
   isolating the data signal from propagating to the output signal when holding the output signal at a stored value.

22. The method of claim 20 further comprising:
   generating the output signal responsive to the pulse signal;
   delaying the pulse signal to generate a delayed pulse signal; and
   turning off the pulse signal responsive to the delayed pulse signal.

23. The method claim 22 wherein the duration of the delaying step determines the width of the pulse signal.

24. The method of claim 20 further comprising:
   turning on a second pulse signal responsive to a complement transition in at least one of the selected signal and the clock signal;
   generating the output signal responsive to the second pulse signal;
   delaying the second pulse signal to generate a second delayed pulse signal; and
   turning off the second pulse signal responsive to the second delayed pulse signal.

25. The method claim 24 wherein the duration of the delaying step determines the width of the second pulse signal.

* * * * *

UNITED STATES PATENT AND TRADEMARK OFFICE
CERTIFICATE OF CORRECTION

PATENT NO. : 6,731,140 B2
DATED : May 4, 2004
INVENTOR(S) : Robert P. Masleid, Akihiko Harada and Christophe Giacomotto It is certified that error appears in the above-identified patent and that said Letters Patent is hereby corrected as shown below:

<u>Column 22,</u>
Line 66, delete "front" and replace with -- from --

Signed and Sealed this

Fifteenth Day of March, 2005

JON W. DUDAS
*Director of the United States Patent and Trademark Office*